(12) United States Patent
Kawai

(10) Patent No.: US 10,623,673 B2
(45) Date of Patent: Apr. 14, 2020

(54) IMAGING DEVICE, IMAGING METHOD, AND IMAGING PROGRAM

(71) Applicant: FUJIFILM Corporation, Tokyo (JP)

(72) Inventor: Tomoyuki Kawai, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/412,070

(22) Filed: May 14, 2019

(65) Prior Publication Data

US 2019/0273881 A1 Sep. 5, 2019

Related U.S. Application Data

(63) Continuation of application No. PCT/JP2017/037244, filed on Oct. 13, 2017.

(30) Foreign Application Priority Data

Nov. 14, 2016 (JP) .................. 2016-221759

(51) Int. Cl.
*H04N 5/217* (2011.01)
*H04N 5/361* (2011.01)
(Continued)

(52) U.S. Cl.
CPC ............ *H04N 5/361* (2013.01); *H04N 5/243* (2013.01); *H04N 5/351* (2013.01); *H04N 5/353* (2013.01);
(Continued)

(58) Field of Classification Search
CPC ........ H04N 5/357; H04N 5/361; H04N 5/378; H04N 5/374; H04N 5/36963; H04N 5/37452; H01L 27/14623
See application file for complete search history.

(56) References Cited

U.S. PATENT DOCUMENTS

| | | | |
|---|---|---|---|
| 9,426,398 B2* | 8/2016 | Ohshitanai | ......... H04N 5/37213 |
| 2004/0182927 A1 | 9/2004 | Nasu | |

(Continued)

FOREIGN PATENT DOCUMENTS

| | | |
|---|---|---|
| JP | 2004-228873 A | 8/2004 |
| JP | 2009-268083 A | 11/2009 |

(Continued)

OTHER PUBLICATIONS

International Preliminary Report on Patentability and the Written Opinion of the International Searching Authority (Forms PCT/IB/326, PCT/IB/373, and PCT/ISA/237) for International Application No. PCT/JP2017/037244, dated May 23, 2019, with English translation.

(Continued)

*Primary Examiner* — Kelly L Jerabek
(74) *Attorney, Agent, or Firm* — Birch, Stewart, Kolasch & Birch, LLP

(57) ABSTRACT

An imaging device includes: a MOS type imaging element as defined herein; a driving control unit performing a first driving control as defined herein, a second driving control as defined herein, and a third driving control as defined herein; and an image processing unit generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

21 Claims, 14 Drawing Sheets

(51) Int. Cl.
*H04N 5/351* (2011.01)
*H04N 5/3745* (2011.01)
*H04N 5/378* (2011.01)
*H04N 5/353* (2011.01)
*H04N 5/243* (2006.01)
*H01L 27/146* (2006.01)

(52) U.S. Cl.
CPC ........... *H04N 5/3532* (2013.01); *H04N 5/378* (2013.01); *H04N 5/37452* (2013.01); *H01L 27/14612* (2013.01); *H01L 27/14623* (2013.01); *H01L 27/14643* (2013.01)

(56) References Cited

U.S. PATENT DOCUMENTS

| | | | |
|---|---|---|---|
| 2005/0094005 A1* | 5/2005 | Xu | H04N 3/1568 348/243 |
| 2009/0251582 A1 | 10/2009 | Oike | |
| 2012/0327278 A1 | 12/2012 | Oike | |
| 2014/0014816 A1 | 1/2014 | Takeda | |
| 2014/0015012 A1 | 1/2014 | Oike | |
| 2015/0256776 A1 | 9/2015 | Okada | |
| 2015/0319388 A1* | 11/2015 | Ohshitanai | H04N 5/378 348/301 |
| 2018/0084211 A1* | 3/2018 | Nishino | H04N 5/357 |
| 2019/0067612 A1* | 2/2019 | Tashiro | H04N 5/357 |

FOREIGN PATENT DOCUMENTS

| | | |
|---|---|---|
| JP | 2011-211448 A | 10/2011 |
| JP | 2012-120076 A | 6/2012 |
| JP | 2012-191379 A | 10/2012 |
| JP | 2014-22795 A | 2/2014 |
| JP | 2014-42343 A | 3/2014 |
| JP | 2015-171049 A | 9/2015 |

OTHER PUBLICATIONS

International Search Report (Form PCT/ISA/210) for International Application No. PCT/JP2017/037244, dated Dec. 26, 2017, with English translation.

* cited by examiner

IMAGING DEVICE, IMAGING METHOD, AND IMAGING PROGRAM

CROSS REFERENCE TO RELATED APPLICATION

This is a continuation of International Application No. PCT/JP2017/037244 filed on Oct. 13, 2017, and claims priority from Japanese Patent Application No. 2016-221759 filed on Nov. 14, 2016, the entire disclosures of which are incorporated herein by reference.

BACKGROUND OF THE INVENTION

1. Field of the Invention

The present invention relates to an imaging device, an imaging method, and a computer readable medium storing an imaging program.

2. Description of the Related Art

In recent years, with high resolution of an imaging element such as a charge coupled device (CCD) image sensor or a complementary metal oxide semiconductor (CMOS) image sensor, a demand for information devices having an imaging function such as an electronic endoscope, a digital still camera, a digital video camera, or a mobile phone with a camera has been rapidly increasing. It should be noted that the information device having the imaging function as described above is referred to as an imaging device.

A MOS type imaging element includes pixels which are two-dimensionally arranged and includes a photoelectric conversion element, a charge holding unit which holds charge generated and accumulated in the photoelectric conversion element, a floating diffusion which transfers the charge held in the charge holding unit, and a readout circuit which outputs a signal according to a potential of the floating diffusion (see JP2014-022795A).

The imaging element described in JP2014-022795A discharges a dark current generated in the charge holding unit to a drain unit before the charge of the photoelectric conversion element is transferred to the charge holding unit.

As a method of detecting a dark current generated in a photoelectric conversion element, JP2012-191379A discloses a method of performing dark imaging in a state where the imaging element is shielded from light before actual imaging.

Although not a technique for detecting a dark current, JP2011-211448A discloses a technique for detecting reset noise generated in a floating diffusion of a readout circuit before the end of exposure in actual imaging.

SUMMARY OF THE INVENTION

An imaging element having a charge holding unit as described in JP2014-022795A can be driven by a rolling shutter system and driven by a global shutter system as well.

The global shutter system is a system in which exposure start timings of all the photoelectric conversion elements are made coincident, charges accumulated in all the photoelectric conversion elements are simultaneously transferred to the charge holding unit to end the exposure, and then signals corresponding to the charges accumulated in the charge holding unit are sequentially read out for each line.

According to the imaging element having the charge holding unit, it is possible to align the start and end timings of the exposure time in all the photoelectric conversion elements without using the mechanical shutter. For this reason, a captured image without distortion can be obtained without being tied down to the operation time of the mechanical shutter.

In such an imaging element described above, in order to obtain information on the dark current generated in the photoelectric conversion element, for example, as described in JP2012-191379A, it is necessary to perform imaging in a state where the imaging element is shielded from light before actual imaging.

In this case, a member (for example, a mechanical shutter) for shielding the imaging element from light is required, and the merit of the imaging element that imaging can be performed without a mechanical shutter is diminished.

In addition, it is necessary to secure the time for performing imaging in a state where the imaging element is shielded from light, which hinders the acceleration of imaging processing.

In the imaging element described in JP2014-022795A, since the dark current generated in the charge holding unit is discharged to the drain unit, information on the dark current cannot be obtained.

JP2011-211448A discloses a technique for detecting the reset noise of the floating diffusion, and information on the dark current of the photoelectric conversion element cannot be obtained.

The present invention has been made in view of the above circumstances, and an object thereof is to provide an imaging device, an imaging method, and a computer readable medium storing an imaging program capable of obtaining information on a dark current generated in a photoelectric conversion element with high precision without performing imaging in a state where an imaging element is shielded from light.

An imaging device of the present invention comprises: a MOS type imaging element including a plurality of pixels including a photoelectric conversion element which receives light and accumulates charge, a charge holding unit which is shielded from light and holds the charge accumulated in the photoelectric conversion element, and a floating diffusion to which the charge is transferred from the charge holding unit, wherein a signal corresponding to a potential of the floating diffusion is read out by a readout circuit; a driving control unit performing a first driving control by which the photoelectric conversion element and the charge holding unit of the pixel are reset to start the exposure of the photoelectric conversion element, and an imaging charge accumulated in the photoelectric conversion element is transferred to the charge holding unit of the pixel to end the exposure, a second driving control by which the readout circuit reads out a signal corresponding to a dark charge held by the charge holding unit before the imaging charge is transferred to the charge holding unit by the first driving control, and a third driving control by which the readout circuit reads out the signal corresponding to the imaging charge held by the charge holding unit after the exposure ends by the first driving control; and an image processing unit generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

An imaging method of the present invention is a method of imaging an subject with a MOS type imaging element including a plurality of pixels including a photoelectric conversion element which receives light and accumulates charge, a charge holding unit which is shielded from light and holds the charge accumulated in the photoelectric conversion element, and a floating diffusion to which the charge is transferred from the charge holding unit, wherein a signal corresponding to a potential of the floating diffusion is read out by a readout circuit. The method comprises: a driving control step of performing a first driving control by which the photoelectric conversion element and the charge holding unit of the pixel are reset to start the exposure of the photoelectric conversion element, and an imaging charge accumulated in the photoelectric conversion element is transferred to the charge holding unit of the pixel to end the exposure, a second driving control by which the readout circuit reads out a signal corresponding to a dark charge held by the charge holding unit before the imaging charge is transferred to the charge holding unit by the first driving control, and a third driving control by which the readout circuit reads out the signal corresponding to the imaging charge held by the charge holding unit after the exposure ends by the first driving control; and an image processing step of generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

An imaging program of the present invention is an imaging program for imaging an subject with a MOS type imaging element including a plurality of pixels including a photoelectric conversion element which receives light and accumulates charge, a charge holding unit which is shielded from light and holds the charge accumulated in the photoelectric conversion element, and a floating diffusion to which the charge is transferred from the charge holding unit, wherein a signal corresponding to a potential of the floating diffusion is read out by a readout circuit. The program causes a computer to execute: a driving control step of performing a first driving control by which the photoelectric conversion element and the charge holding unit of the pixel are reset to start the exposure of the photoelectric conversion element and an imaging charge accumulated in the photoelectric conversion element is transferred to the charge holding unit of the pixel to end the exposure, a second driving control by which the readout circuit reads out a signal corresponding to a dark charge held by the charge holding unit before the imaging charge is transferred to the charge holding unit by the first driving control, and a third driving control by which the readout circuit reads out the signal corresponding to the imaging charge held by the charge holding unit after the exposure ends by the first driving control; and an image processing step of generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

According to the present invention, it is possible to provide an imaging device, an imaging method, and an imaging program capable of obtaining information on a dark current generated in a photoelectric conversion element with high precision without performing imaging in a state where an imaging element is shielded from light.

DESCRIPTION OF THE PREFERRED EMBODIMENTS

Hereinafter, embodiments of the present invention will be described with reference to the drawings.

Figure 1:
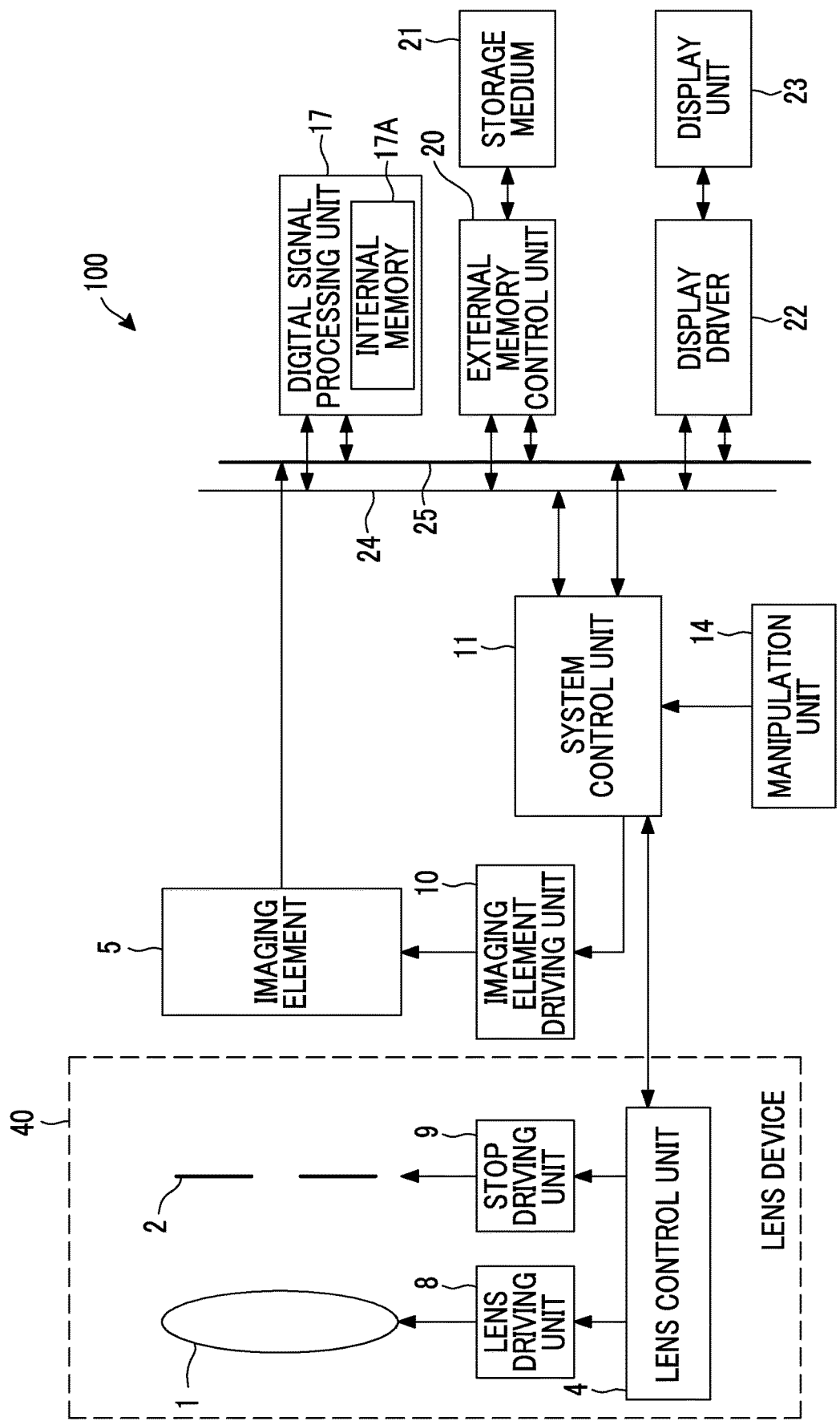
FIG. 1 is a diagram illustrating a schematic configuration of a digital camera 100 that is an embodiment of an imaging device of the present invention.

FIG. 1 is a diagram illustrating a schematic configuration of a digital camera 100 that is an embodiment of an imaging device of the present invention.

The digital camera 100 illustrated in FIG. 1 comprises a lens device 40 including an imaging lens 1, a stop 2, a lens control unit 4, a lens driving unit 8, and a stop driving unit 9.

In the embodiment, the lens device 40 is described as being attachable to and detachable from a main body of the digital camera 100, but may be fixed to the main body of the digital camera 100. The imaging lens 1 and the stop 2 constitute an imaging optical system.

The lens control unit 4 of the lens device 40 is configured to be capable of communicating with a system control unit 11 in the main body of the digital camera 100 by cable or wirelessly.

According to a command from the system control unit 11, the lens control unit 4 drives a focus lens included in the imaging lens 1 via the lens driving unit 8, or drives the stop 2 via the stop driving unit 9.

The main body of the digital camera 100 comprises a MOS type imaging element 5 such as a CMOS image sensor that images a subject through the imaging optical system, an imaging element driving unit 10 that drives the imaging element 5, the system control unit 11 that performs overall control of an entire electric control system of the digital camera 100, a manipulation unit 14, a digital signal processing unit 17, an external memory control unit 20 to which a storage medium 21 is detachably connected, and a display driver 22 that drives a display unit 23 such as an organic electro luminescence (EL), and liquid crystal display (LCD) which is mounted on a rear surface of the main body.

The system control unit 11 includes various processors, a random access memory (RAM), and a read only memory (ROM), and totally controls the entire digital camera 100.

The system control unit 11 causes a processor to execute a program including an imaging program stored in a built-in ROM to realize each function described later.

The digital signal processing unit 17 includes various processors, a RAM, and a ROM, and the processors execute a program including imaging program stored in the ROM to perform various processes described later.

The various processors include a programmable logic device (PLD) that is a processor of which a circuit configuration can be changed after manufacture, such as a central processing unit (CPU) or a field programmable gate array (FPGA) that is a general-purpose processor that executes a program to perform various processes, or a dedicated electric circuit that is a processor having a circuit configuration designed to be dedicated to execute a specific process, such as application specific integrated circuit (ASIC).

More specifically, structures of the various processors are electric circuits in which circuit elements such as semiconductor elements are combined.

Each of the processors of the system control unit 11 and the digital signal processing unit 17 may be constituted by one of various processors, or may be constituted by a combination of two or more of the same or different types of processors (for example, a combination of a plurality of FPGAs or a combination of a CPU and an FPGA).

The digital signal processing unit 17, the external memory control unit 20, and the display driver 22 are connected to each other via a control bus 24 and a data bus 25, and operate based on a command from the system control unit 11.

Figure 2:
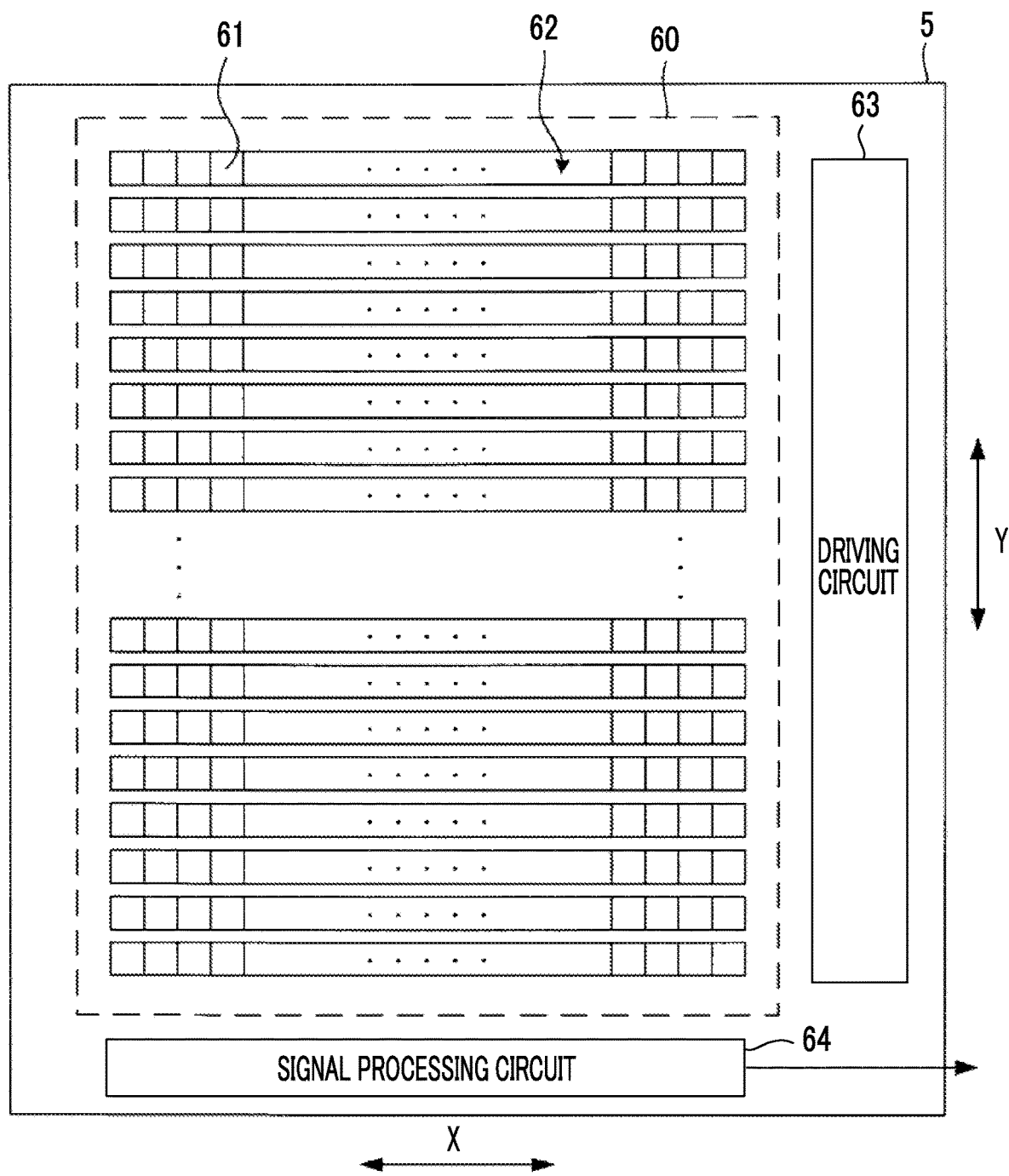
FIG. 2 is a schematic plan view illustrating a schematic configuration of an imaging element 5 illustrated in FIG. 1.
Figure 3:
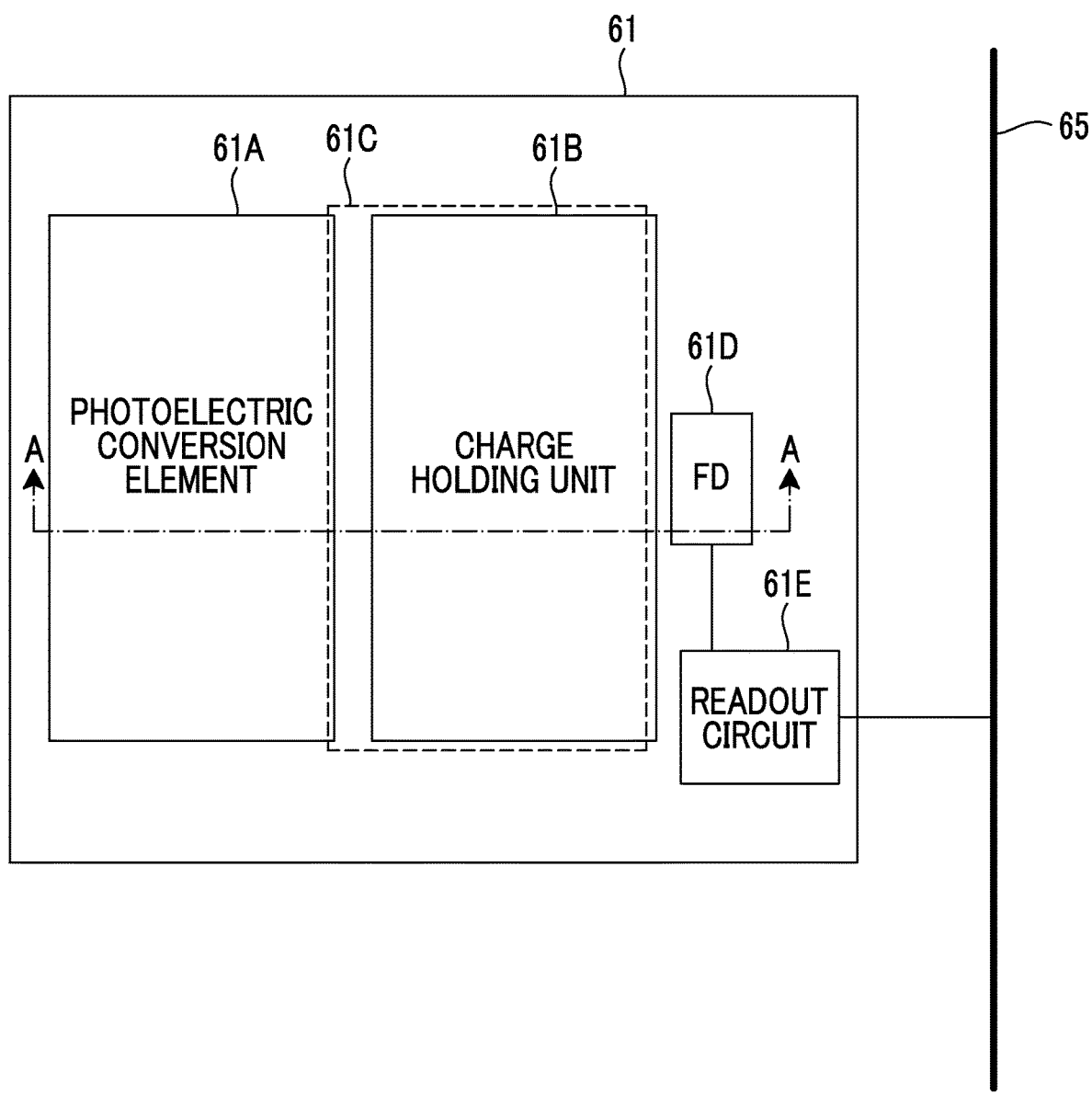
FIG. 3 is a schematic plan view illustrating a schematic configuration of a pixel 61 of the imaging element 5 illustrated in FIG. 2.
Figure 4:
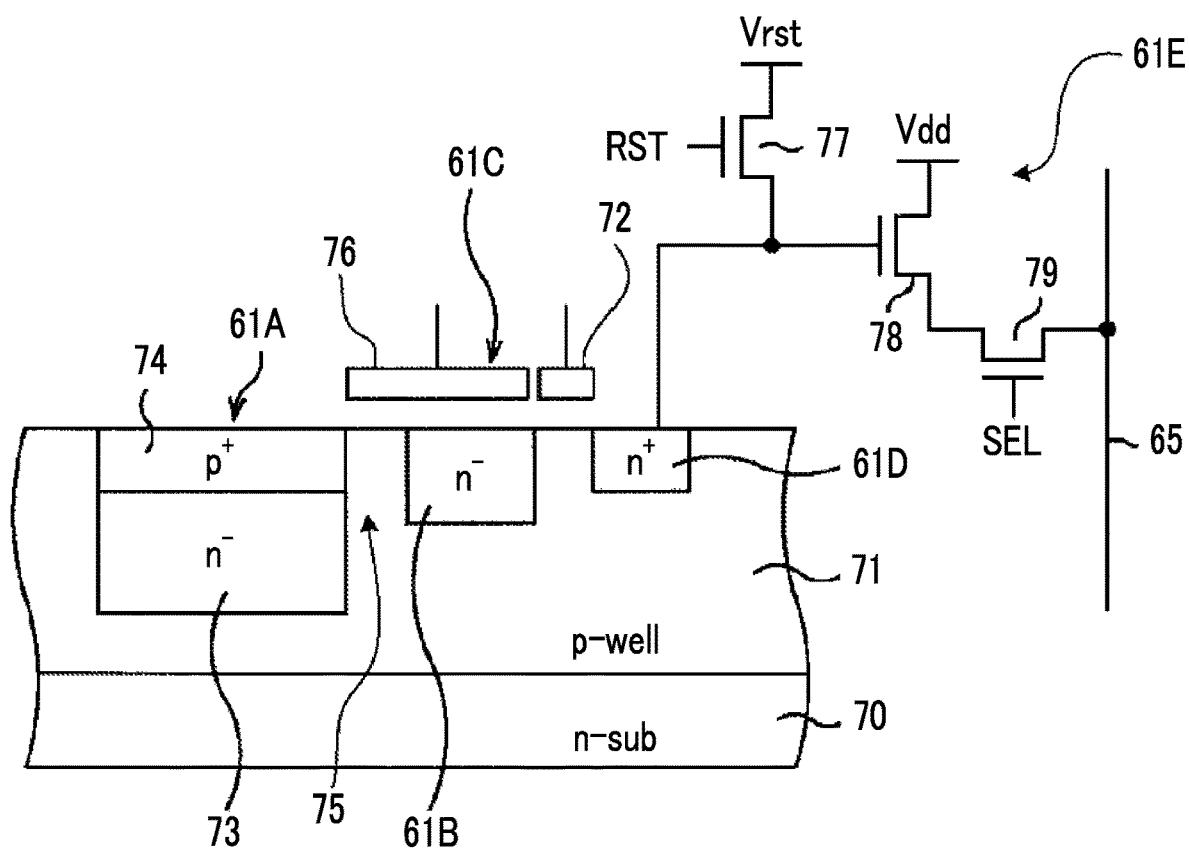
FIG. 4 is a schematic cross-sectional view taken along the line A-A of the pixel 61 of the imaging element 5 illustrated in FIG. 3.

FIG. 2 is a schematic plan view illustrating a schematic configuration of the imaging element 5 illustrated in FIG. 1. FIG. 3 is a schematic plan view illustrating a schematic configuration of a pixel 61 of the imaging element 5 illustrated in FIG. 2. FIG. 4 is a schematic cross-sectional view taken along the line A-A of the pixel 61 of the imaging element 5 illustrated in FIG. 3.

The imaging element 5 comprises a light reception surface 60 in which a plurality of pixel rows 62 including a plurality of pixels 61 arranged in a row direction X which is one direction are arranged in a column direction Y orthogonal to the row direction X, a driving circuit 63 that drives the pixels 61 arranged on the light reception surface 60, and a signal processing circuit 64 that processes a signal read out to a signal line from each pixel 61 of the pixel row 62 arranged on the light reception surface 60.

Hereinafter, an upward end in the column direction Y of the light reception surface 60 in FIG. 2 is referred to as an upper end, and a downward end in the column direction Y of the light reception surface 60 is referred to as a lower end.

As illustrated in FIG. 3, the pixel 61 comprises a photoelectric conversion element 61A, a charge holding unit 61B, a charge transfer unit 61C, a floating diffusion 61D, and a readout circuit 61E formed on a semiconductor substrate.

The photoelectric conversion element 61A receives light having passed through the imaging optical system of the lens device 40 and generates and accumulates charges corresponding to the amount of the received light. The photoelectric conversion element 61A is constituted by a photodiode or the like.

The charge transfer unit 61C transfers the charge accumulated in the photoelectric conversion element 61A to the charge holding unit 61B. The charge transfer unit 61C is constituted by an impurity area in the semiconductor substrate and an electrode formed above the impurity area.

A voltage applied to the electrode constituting the charge transfer unit 61C is controlled by the driving circuit 63 to transfer charge from the photoelectric conversion element 61A to the charge holding unit 61B.

The charge holding unit 61B holds the charge transferred from the photoelectric conversion element 61A by the charge transfer unit 61C. The charge holding unit 61B is formed of an impurity area in the semiconductor substrate.

The floating diffusion 61D converts charge into a voltage signal, and charge held in the charge holding unit 61B is transferred.

The readout circuit 61E is a circuit for reading a signal (imaging signal or dark signal) corresponding to a potential of the floating diffusion 61D to the signal line 65. The readout circuit 61E is driven by the driving circuit 63.

As shown in FIG. 4, a P-well layer 71 is formed on a surface of an N-type substrate 70, and a photoelectric conversion element 61A is formed on the surface portion of the P-well layer 71. The photoelectric conversion element 61A is constituted by an N-type impurity layer 73 and a P-type impurity layer 74 formed on the N-type impurity layer 73. The N-type substrate 70 and the P-well layer 71 constitute a semiconductor substrate.

On the surface portion of the P-well layer 71, a charge holding unit 61B made of an N-type impurity layer is formed slightly away from the photoelectric conversion element 61A. Above an area 75 of the P-well layer 71 between the charge holding unit 61B and the photoelectric conversion element 61A, a transfer electrode 76 is formed via an oxide film (not illustrated).

The area 75 and the transfer electrode 76 constitute the charge transfer unit 61C. In the example of FIG. 4, the transfer electrode 76 is formed above the charge holding unit 61B, but the transfer electrode 76 may be formed at least above the area 75. By controlling the potential of the transfer electrode 76 to form a channel in the area 75, it is possible to transfer the charge accumulated in the photoelectric conversion element 61A to the charge holding unit 61B. The potential of the transfer electrode 76 is controlled by the driving circuit 63.

On the surface portion of the P-well layer 71, the floating diffusion 61D made of an N-type impurity layer is formed slightly away from the charge holding unit 61B. A reading electrode 72 is formed above the P-well layer 71 between the charge holding unit 61B and the floating diffusion 61D via an oxide film (not shown).

By controlling the potential of the reading electrode 72 to form a channel in an area between the charge holding unit 61B and the floating diffusion 61D, the charge held in the charge holding unit 61B is transferred to the floating diffusion 61D. The potential of the reading electrode 72 is controlled by the driving circuit 63.

In the example illustrated in FIG. 4, the readout circuit 61E includes a reset transistor 77 for resetting the potential of the floating diffusion 61D, an output transistor 78 for converting the potential of the floating diffusion 61D into a signal and outputting the signal, and a selection transistor 79 for selectively reading the signal output from the output transistor 78 to the signal line 65. The configuration of the readout circuit is an example, and it is not limited thereto.

It should be noted that the readout circuit 61E may be shared by a plurality of pixels 61.

In a plan view of the pixel 61 illustrated in FIG. 3, a partial area of the photoelectric conversion element 61A, the charge holding unit 61B, the charge transfer unit 61C, the floating diffusion 61D, and the readout circuit 61E are shielded from light a light shielding film (not illustrated).

For the pixel 61 at the right end of each pixel row 62 arranged on the light reception surface 60 of the imaging element 5, the photoelectric conversion element 61A, the charge holding unit 61B, the charge transfer unit 61C, the floating diffusion 61D, and the readout circuit 61E are entirely shielded from light by the light shielding film, and the pixel 61 functions as a pixel for black level detection.

The driving circuit 63 illustrated in FIG. 2 drives the transfer electrode 76, the reading electrode 72, and the readout circuit 61E of each pixel 61 under the control of the imaging element driving unit 10.

The driving circuit 63 can perform global reset driving, global shutter driving, signal read driving, rolling reset driving, and rolling shutter driving.

The global reset driving is a drive in which resetting of the photoelectric conversion element 61A and the charge holding unit 61B (discharging of charges accumulated in the photoelectric conversion element 61A and the charge holding unit 61B) is performed simultaneously in all the pixels 61.

The photoelectric conversion element 61A and the charge holding unit 61B of the pixel 61 are reset by bringing the charge transfer unit 61C into a state in which charge can be transferred, forming a channel in the semiconductor substrate under the reading electrode 72, and resetting the floating diffusion 61D by the reset transistor 77.

The global shutter driving is a drive for simultaneously driving the charge transfer units 61C of all the pixels 61 to simultaneously transfer the charges accumulated in the photoelectric conversion elements 61A of the respective pixels 61 to the charge holding units 61B.

In the signal read driving, driving the reading electrodes 72 of the respective pixels 61 in the pixel row 62, transferring the charge accumulated in the charge holding unit 61B of each pixel 61 to the floating diffusions 61D, and reading the signal corresponding to the charge to the signal line 65 is sequentially performed while changing the pixel row 62.

The rolling reset driving is a driving in which resetting of the photoelectric conversion element 61A and the charge holding unit 61B of each pixel 61 in the pixel row 62 is sequentially performed while changing the pixel row 62.

In the rolling shutter driving, driving the charge transfer unit 61C and the reading electrodes 72 of the respective pixels 61 in the pixel row 62, transferring the charge accumulated in the photoelectric conversion element 61A of each pixel 61 to the floating diffusions 61D through the charge holding unit 61B, and reading the signal corresponding to the charge to the signal line 65 is sequentially performed while changing the pixel row 62.

The signal processing circuit 64 illustrated in FIG. 2 performs a correlative double sampling process on the signal read out from each pixel 61 of the pixel row 62 to the signal line 65, converts the signal after the correlative double sampling process into a digital signal, and outputs the digital signal to the data bus 25. The signal processing circuit 64 is controlled by the imaging element driving unit 10.

In a case where an imaging instruction is issued in the still image capturing mode, the processor of the system control unit 11 illustrated in FIG. 1 functions as a driving control unit that performs a first driving control, a second driving control, and a third driving control.

The first driving control is control to sequentially execute the global reset driving and the global shutter driving by the driving circuit 63.

In this first driving control, the photoelectric conversion element 61A and the charge holding unit 61B of each pixel 61 are reset to start the exposure of the photoelectric conversion element 61A, and thereafter an imaging charge accumulated in the photoelectric conversion element 61A is transferred to the charge holding unit 61B of the pixel 61 to end the exposure.

In the second driving control, the driving circuit 63 carries out the signal read driving before the global shutter driving by the first driving control is performed during the period in which the first driving control is performed.

In the second driving control, a dark signal corresponding to a dark charge held in the charge holding unit 61B is read out by the readout circuit 61E before the imaging charge is transferred to the charge holding unit 61B by the global shutter driving of the first driving control.

The third driving control is a control to execute the signal read driving by the driving circuit 63 after the first driving control is performed.

In the third driving control, after end of the exposure by the first driving control, for every pixel row 62, the imaging signal corresponding to the imaging charge held in the charge holding unit 61B is read out by the readout circuit 61E.

The system control unit 11 alternatively repeats the control of the rolling reset driving and the rolling shutter driving by the driving circuit 63 during the period in which the imaging instruction is not being issued in the still image capturing mode.

The digital signal processing unit 17 illustrated in FIG. 1 performs a process such as black level correction, interpolation arithmetic, gamma correction calculation, and RGB/YC conversion process on a captured image signal that is a set of imaging signals output from the imaging element 5 by the third driving control or the rolling shutter driving to generate a live view image data to be displayed on the display unit 23 and a captured image data to be stored in the storage medium 21.

The digital signal processing unit 17 performs the black level correction of the captured image signal output from the imaging element 5 based on the signal read out from the pixel 61 for black level detection included in the imaging element 5.

Further, the digital signal processing unit 17 performs the black level correction of the captured image signal output from the imaging element 5 by the third driving control based on the dark image signal constituted by the dark signal corresponding to the dark charge read out from the each pixel 61 of the imaging element 5 by the second driving control. The processor of the digital signal processing unit 17 functions as an image processing unit.

The black level correction is a signal process of eliminating a dark current (a signal corresponding to the dark charge generated in the photoelectric conversion element 61A in a state where the photoelectric conversion element 61A is shielded from light) generated in the photoelectric conversion element 61A of the imaging element 5.

The operation of the digital camera 100 configured as described above in the still image capturing mode will be described.

Figure 5:
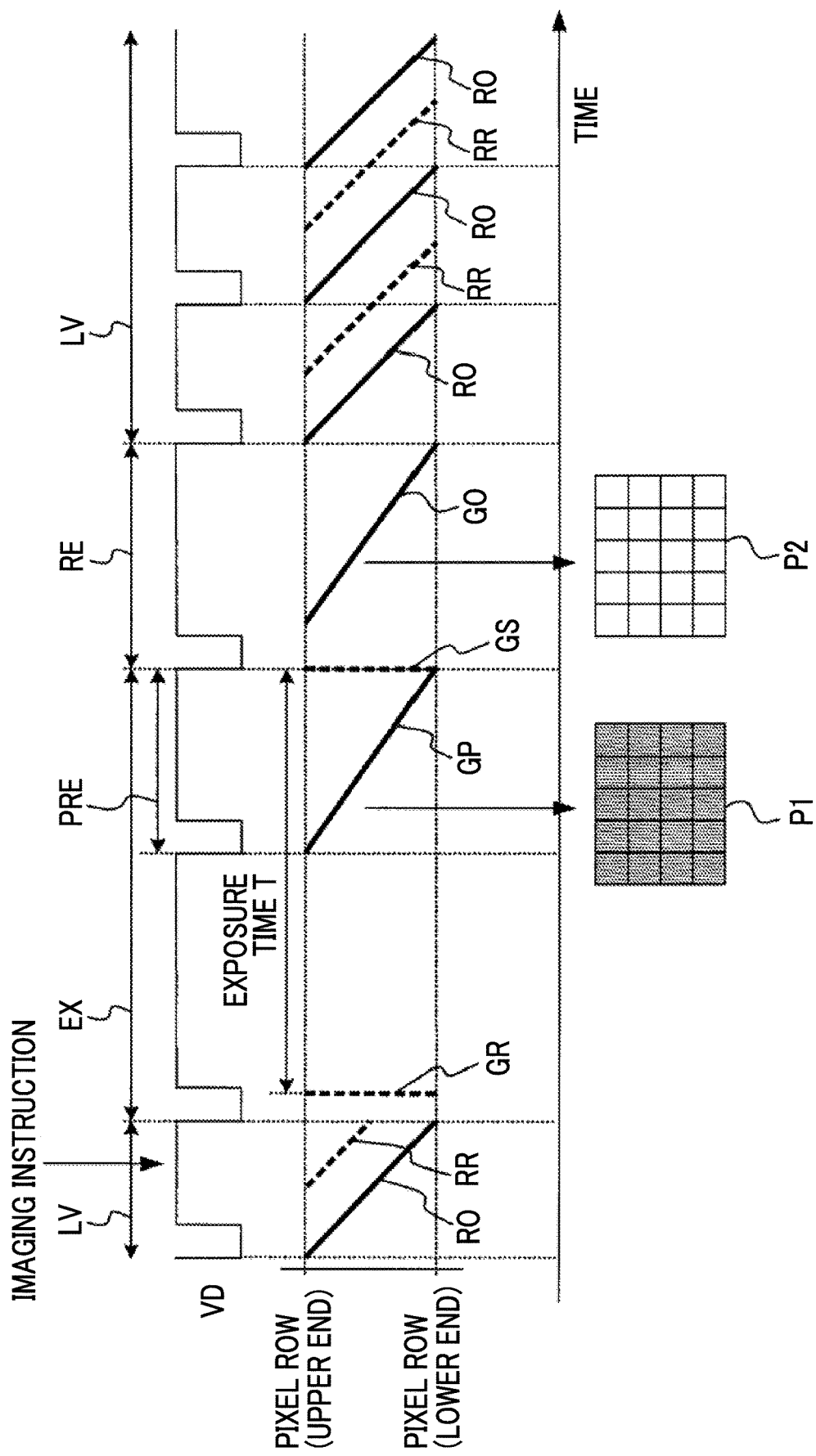
FIG. 5 is a timing chart illustrating an operation of the digital camera illustrated in FIG. 1 in a still image capturing mode.

FIG. 5 is a timing chart illustrating an operation of the digital camera 100 illustrated in FIG. 1 in the still image capturing mode.

In FIG. 5, the horizontal axis represents time. In the upper part of FIG. 5, the vertical synchronizing signal VD is shown.

In the lower part of FIG. 5, a drive timing of each pixel row 62 on the light reception surface 60 of the imaging element 5 is shown. In the lower part of FIG. 5, the vertical axis shows a position in the column direction Y of the pixel row 62.

A straight line RR and a straight line GR shown in FIG. 5 respectively show timings at which resetting of each photoelectric conversion element 61A and each charge holding unit 61B included in the pixel row 62 is performed.

A straight line GP shown in FIG. 5 shows a timing at which the readout circuit 61E reads out the dark signal corresponding to the dark charge held in each charge holding unit 61B included in the pixel row 62.

A straight line GS shown in FIG. 5 shows a timing at which the charges are transferred to the charge holding unit 61B from each photoelectric conversion element 61A included in the pixel row 62.

A straight line GO shown in FIG. 5 shows a timing at which the readout circuit 61E reads out the signal corresponding to the charge held in each charge holding unit 61B included in the pixel row 62.

A straight line RO shown in FIG. 5 shows a timing at which the charge accumulated in each photoelectric conversion element 61A included in the pixel row 62 is transferred to the floating diffusion 61D, and the signal corresponding to the charge is read out by the readout circuit 61E.

In a case where the digital camera 100 is set to the still image capturing mode, the live view sequence LV is started.

In the live view sequence LV, the system control unit 11 first performs the rolling shutter driving by the driving circuit 63.

By the rolling shutter driving, the pixel rows 62 are sequentially selected from the upper end side to the lower end side of the light reception surface 60 as indicated by the straight line RO, for example at a ratio of one in four, and the signal corresponding to the charge accumulated in each photoelectric conversion element 61A in the selected pixel row 62 is read out by the readout circuit 61E.

The signal read out first at the straight line RO after the live view sequence LV starts is not used for generating the live view image data but is discarded.

Next, the system control unit 11 performs a rolling reset driving by the driving circuit 63.

By this rolling reset driving, the pixel rows 62 are sequentially selected from the upper end side to the lower end side of the light reception surface 60 as indicated by the straight line RR, and each photoelectric conversion elements 61A and each charge holding unit 61B of the selected pixel row 62 are reset. As a result, exposure for live viewing is started at different timing for each pixel row 62.

In a case where a predetermined exposure time has elapsed, the system control unit 11 performs the rolling shutter driving by the driving circuit 63.

By this rolling shutter driving, the pixel rows 62 are sequentially selected from the upper end side to the lower end side of the light reception surface 60 as indicated by the straight line RO, at a ratio of one in four, and in the selected pixel row 62, transfer of imaging charge from the photoelectric conversion element 61A to the charge holding unit 61B and transfer of imaging charge from the charge holding unit 61B to the floating diffusion 61D are performed. Then, an imaging signal corresponding to the imaging charge is read out.

As a result, a captured image signal constituted by imaging signals read out from the sequentially selected pixel rows 62 is output to the data bus 25.

The digital signal processing unit 17 generates a live view image data based on the captured image signal output to the data bus 25 and transfers the data to the display driver 22. As a result, the live view image based on the live view image data is displayed on the display unit 23.

The above processes are repeatedly performed in synchronization with the vertical synchronizing signal VD until imaging instruction is issued.

In a case where an imaging instruction is issued during the live view sequence LV, a still image exposure sequence EX is started at the falling timing of the vertical synchronizing signal VD immediately after the imaging instruction is issued.

In the still image exposure sequence EX, the system control unit 11 first performs global reset driving by the driving circuit 63.

By the global reset driving, the photoelectric conversion element 61A and the charge holding unit 61B are simultaneously reset in all the pixel rows 62 as indicated by the straight line GR, and the still images in all the pixel rows 62 is start to be exposed at the same timing.

In a case where a predetermined time elapsed after the start of the exposure of the still image, the charge holding unit pre-reading sequence PRE is started as a part of the still image exposure sequence EX.

I In charge holding unit pre-reading sequence PRE, the system control unit 11 performs the signal read driving by the driving circuit 63.

By the signal read driving, the pixel rows 62 are sequentially selected from the upper end side to the lower end side of the light reception surface 60 as indicated by the straight line GP, and in the selected pixel row 62, transfer of the dark charge from the charge holding unit 61B to the floating diffusion 61D and reading of the dark signal corresponding to the dark charge to the signal line 65 are performed.

By the charge holding unit pre-reading sequence PRE, a dark image signal P1 constituted by the dark signal corresponding to the dark charge generated in each charge holding unit 61B after the still image is start to be exposed is output to the data bus 25. The dark image signal P1 is temporarily stored in an internal memory 17A of the digital signal processing unit 17.

Thereafter, in a case where an exposure time T has elapsed since the still image is started to be exposed, the system control unit 11 performs the global shutter driving by the driving circuit 63.

By the global shutter driving, the imaging charge is transferred from the photoelectric conversion element 61A to the charge holding unit 61B simultaneously in all the pixel rows 62, as indicated by the straight line GS, and in all the pixel rows 62, exposure of the still image ends at the same timing, and the still image exposure sequence EX ends.

Upon end of the still image exposure sequence EX, the still image reading sequence RE is started. In the still image reading sequence RE, the system control unit 11 performs the signal read driving by the driving circuit 63.

By the signal read driving, the pixel rows 62 are sequentially selected from the upper end side to the lower end side of the light reception surface 60 as indicated by the straight line GO, and in the selected pixel row 62, transfer of the imaging charge from the charge holding unit 61B to the floating diffusion 61D and reading of the imaging signal corresponding to the imaging charge to the signal line 65 are performed.

In a case where the reading of the imaging signals from all the pixels 61 ends, the live view sequence LV is started.

A captured image signal P2 constituted by imaging signals corresponding to imaging charges generated in the photoelectric conversion element 61A during the exposure period of the still image is output to the data bus 25. The captured image signal P2 is temporarily stored in an internal memory 17A of the digital signal processing unit 17.

The digital signal processing unit 17 calculates the black level of the captured image signal P2 based on the dark image signal P1 and performs the black level correction of the captured image signal P2 based on the calculated black level.

For example, the digital signal processing unit 17 calculates an average value of all the dark signals constituting the dark image signal P1 and subtracts the average value from each imaging signal constituting the captured image signal P2, to perform the black level correction of the captured image signal P2.

The digital signal processing unit 17 subtracts each dark signal constituting the dark image signal P1 read out from the pixel 61 from which each imaging signal is read out from each imaging signal constituting the captured image signal P2 to perform the black level correction of the captured image signal P2.

Then, the digital signal processing unit 17 processes the captured image signal P2 after the black level correction, generates captured image data, and stores the data in the storage medium 21.

The timing chart shown in FIG. 5 illustrates an operation performed in a case where the exposure time T is longer than the minimum time (hereinafter referred to as the pre-read time) required for reading the dark signal from the charge holding unit 61B indicated by the straight line GP.

However, in a case where the exposure time T is shorter than the pre-read time due to a bright subject or the like, it is impossible to execute the charge holding unit pre-reading sequence PRE during the exposure time of the still image.

Therefore, in a case where the exposure time T is shorter than the pre-read time, the system control unit 11 skips the execution of the second driving control indicated by the straight line GP.

Figure 6:
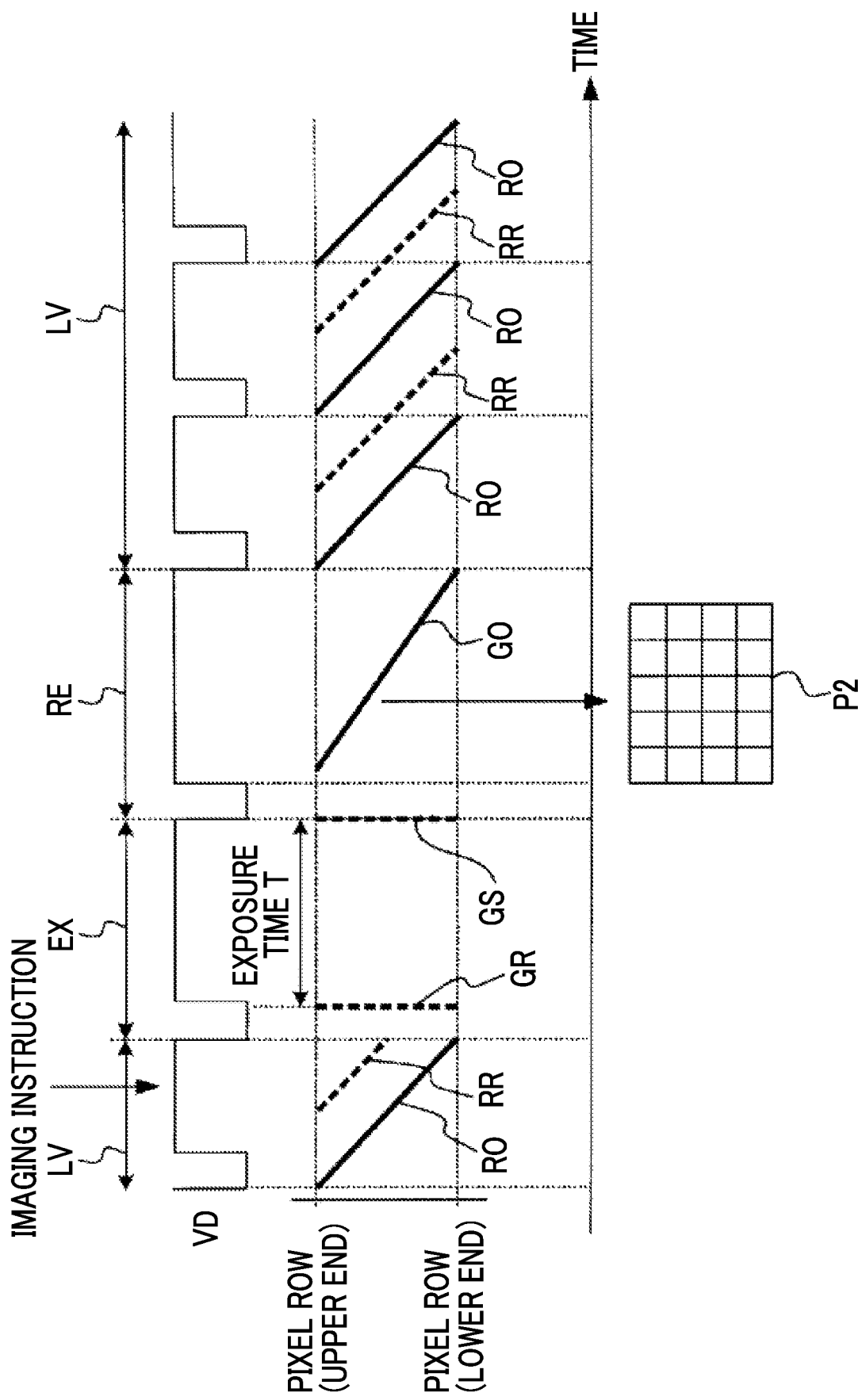
FIG. 6 is a timing chart illustrating another operation of the digital camera illustrated in FIG. 1 in the still image capturing mode.

FIG. 6 is a timing chart illustrating another operation of the digital camera in the still image capturing mode shown in FIG. 1, in which the exposure time T is shorter than the pre-read time.

The timing chart illustrated in FIG. 6 is the same as the timing chart illustrated in FIG. 5, except that the charge holding unit pre-reading sequence PRE is skipped.

In the operation shown in FIG. 6, since the charge holding unit pre-reading sequence PRE is skipped, it is impossible to acquire the dark image signal P1.

Therefore, the digital signal processing unit 17, calculates the black level based on the imaging signal read out from the pixel 61 for the black level detection among the imaging signals constituting the captured image signal P2 read out in the Still image reading sequence RE. For example, an average value of the imaging signals read out from the pixels 61 for the black level detection is calculated as a black level.

Then, the digital signal processing unit 17 subtracts the black level from each imaging signal constituting the captured image signal P2, thereby performing the black level correction of the captured image signal P2. The digital signal processing unit 17 processes the captured image signal P2 after the black level correction, generates captured image data, and stores the data in the storage medium 21.

Figure 7:
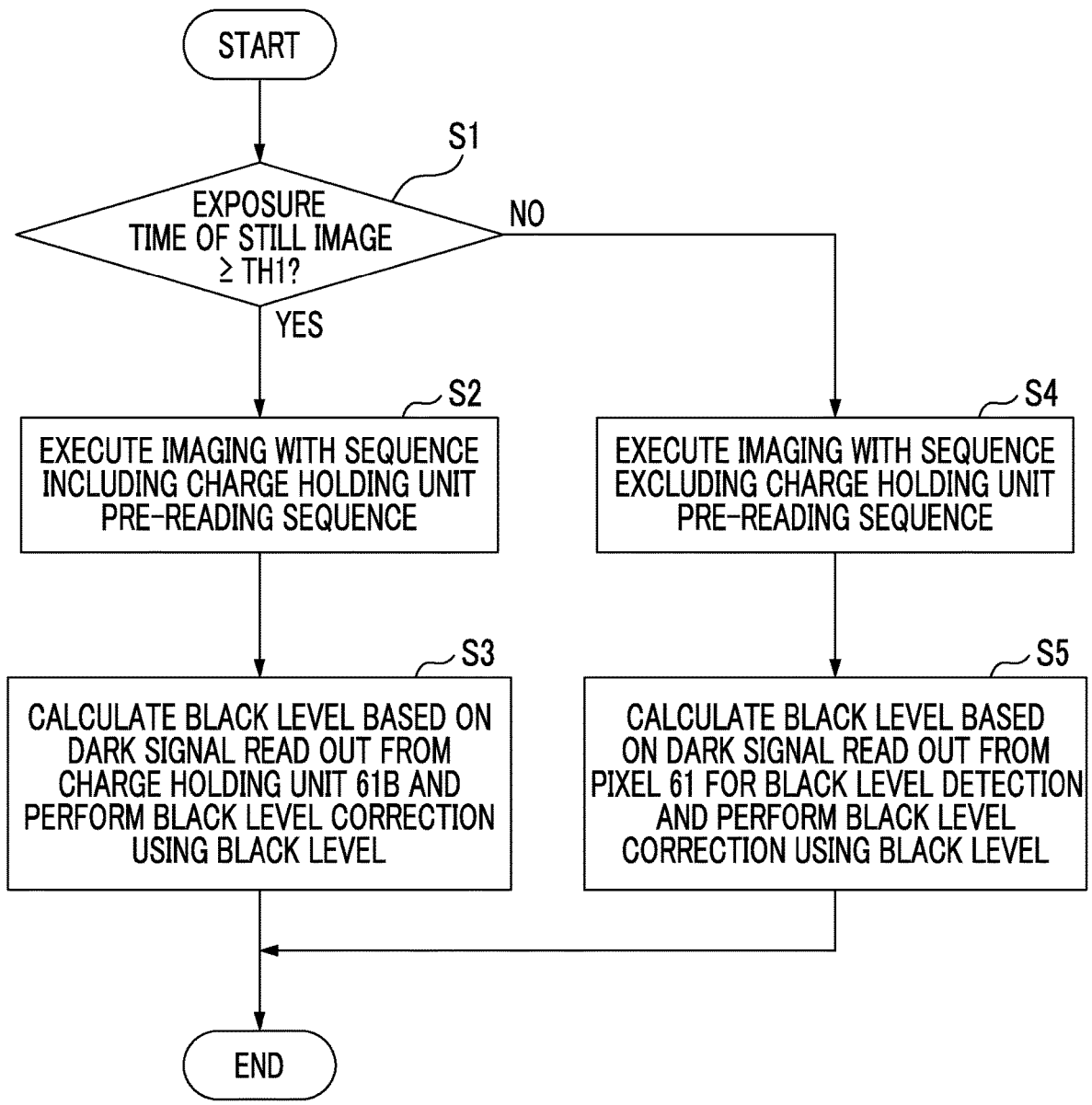
FIG. 7 is a flowchart for explaining the operation of the digital camera 100 illustrated in FIG. 1 in the still image capturing mode.

FIG. 7 is a flowchart for explaining the operation of the digital camera 100 illustrated in FIG. 1 in the still image capturing mode.

In a case where the exposure time T of the set still image is equal to or greater than the threshold value TH1 (Step S1, YES), the system control unit 11 executes the charge holding unit pre-reading sequence PRE during the exposure of a still image as illustrated in the timing chart shown in FIG. 5 (Step S2). For the threshold value TH1, the pre-read time is set.

Then, the digital signal processing unit 17 calculates a black level based on the dark image signal read out from the charge holding unit 61B by the charge holding unit pre-reading sequence PRE, and uses the black level to perform the black level correction of the captured image signal read out by the still image reading sequence RE (Step S3).

In a case where the exposure time T is lower than the threshold value TH1 (Step S1, NO), the system control unit 11 skips the charge holding unit pre-reading sequence PRE during the exposure of a still image as illustrated in the timing chart shown in FIG. 6 (Step S4).

Then, the digital signal processing unit 17 calculates a black level based on the imaging signal read out from the pixel 61 for the black level detection among captured image signals read out by the still image reading sequence RE, and then uses the black level to perform the black level correction of the captured image signal read out by the still image reading sequence RE (Step S5).

As described above, the digital camera 100 of FIG. 1 reads out the dark signal corresponding to the dark charge generated in the charge holding unit 61B during the exposure period of the still image, and calculates a black level based on the dark signal. Then, using the black level, the black level correction of the captured image signal obtained during the exposure period of the still image is performed.

The charge holding unit 61B and the photoelectric conversion element 61A are disposed close to each other, and since the charge holding unit 61B and the photoelectric conversion element 61A are all constituted by impurity areas in the semiconductor substrate, both have structures and characteristics similar to each other. That is, the generation state of dark charges in the charge holding unit 61B and the generation state of dark charges in the photoelectric conversion element 61A are similar.

For this reason, by calculating the black level based on the dark signal corresponding to the dark charge generated in the charge holding unit 61B, it is possible to enhance the reliability of the black level and to generate high-quality captured image data of the image.

Further, according to the digital camera 100, in a case where the exposure time of a still image is less than the threshold value TH1, the charge holding unit pre-reading sequence PRE is not performed, so that the power consumption can be reduced.

It is found that a relationship between a first dark charge generated in the photoelectric conversion element 61A of the pixel 61 for black level detection and the second dark charge generated in the photoelectric conversion element 61A of the pixel 61 other than the pixel 61 for the black level detection varies depending on the exposure time T.

For example, in a case where the exposure time T is short, the amount of the first dark charge and the amount of the second dark charge are substantially the same. However, in a case where the exposure time T is long, the difference between the amount of the first dark charge and the amount of the second dark charge is large. In a case where the difference between the first dark charge and the second dark charge is large, since it is possible to perform the black level correction with high accuracy, it is preferable to perform a sequence illustrated in FIG. 5.

Therefore, the threshold value TH1 may be set to be larger than the pre-read time. As the threshold value TH1, a lower limit value of the exposure time is set, the lower limit value of the exposure time in which the difference between the amount of the first dark charge and the amount of the second dark charge becomes large and the reliability of the black level calculated using the first dark charge becomes insufficient. According to this configuration, the possibility that the charge holding unit pre-reading sequence PRE is skipped is increased, so that power consumption can be reduced.

If the system has a configuration such that the exposure time T can only be set to be equal to or longer than the pre-read time, it is not necessary to perform the imaging sequence exemplified in FIG. 6, and steps S1, S4, and S5 in FIG. 7, is unnecessary.

Figure 8:
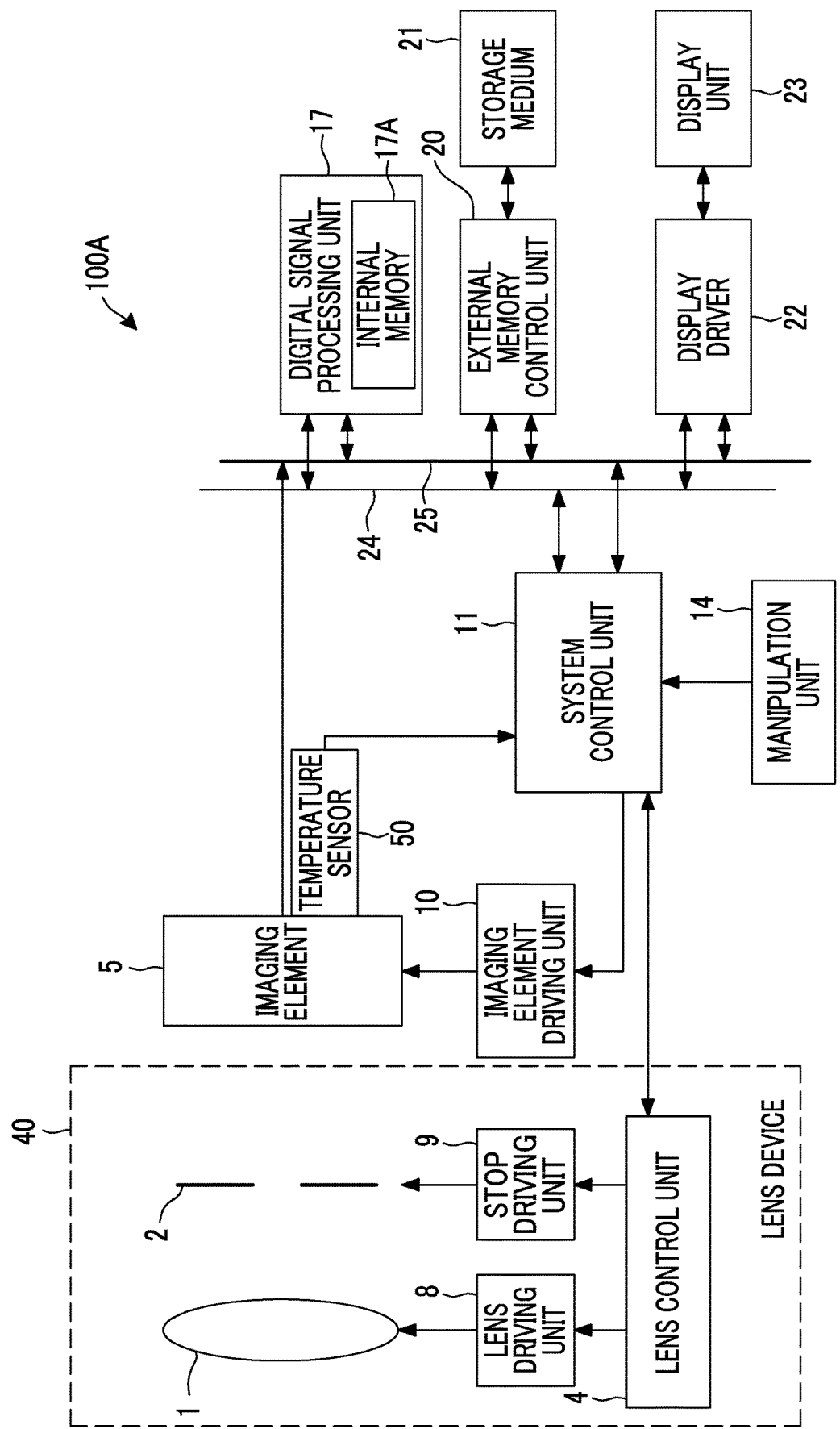
FIG. 8 is a diagram illustrating a schematic configuration of a digital camera 100A that is a modification example of the digital camera 100 illustrated in FIG. 1.

FIG. 8 is a diagram illustrating a schematic configuration of a digital camera 100A that is a modification example of the digital camera 100 illustrated in FIG. 1. The digital camera 100A has the same configuration as that of the digital camera 100 except that a temperature sensor 50 is further included.

The temperature sensor 50 is provided in the vicinity of the imaging element 5 and detects the temperature of the imaging element 5. The temperature information detected by the temperature sensor 50 is input to the system control unit 11.

A relationship between the first dark charge generated in the photoelectric conversion element 61A of the pixel 61 for black level detection and the second dark charge generated in the photoelectric conversion element 61A of the pixel 61 (hereinafter referred to as an effective pixel) other than the pixel 61 for the black level detection varies depending on the temperature of the imaging element 5.

For example, in a case where the temperature is low, the amount of the first dark charge and the amount of the second dark charge are substantially the same. However, in a case where the temperature is high, the difference between the first dark charge and the second dark charge increases.

In the case where the imaging instruction is issued, in a case where the temperature of the imaging element 5 is lower than the threshold value TH2, the system control unit 11 skips the second driving control (charge holding unit pre-reading sequence PRE) and performs the first driving control and the third driving control, and in a case where the temperature of the imaging element 5 is equal to or higher than the threshold value TH2, the system control unit 11 performs the first driving control, the second driving control, and the third driving control so as to reduce power consumption.

Figure 9:
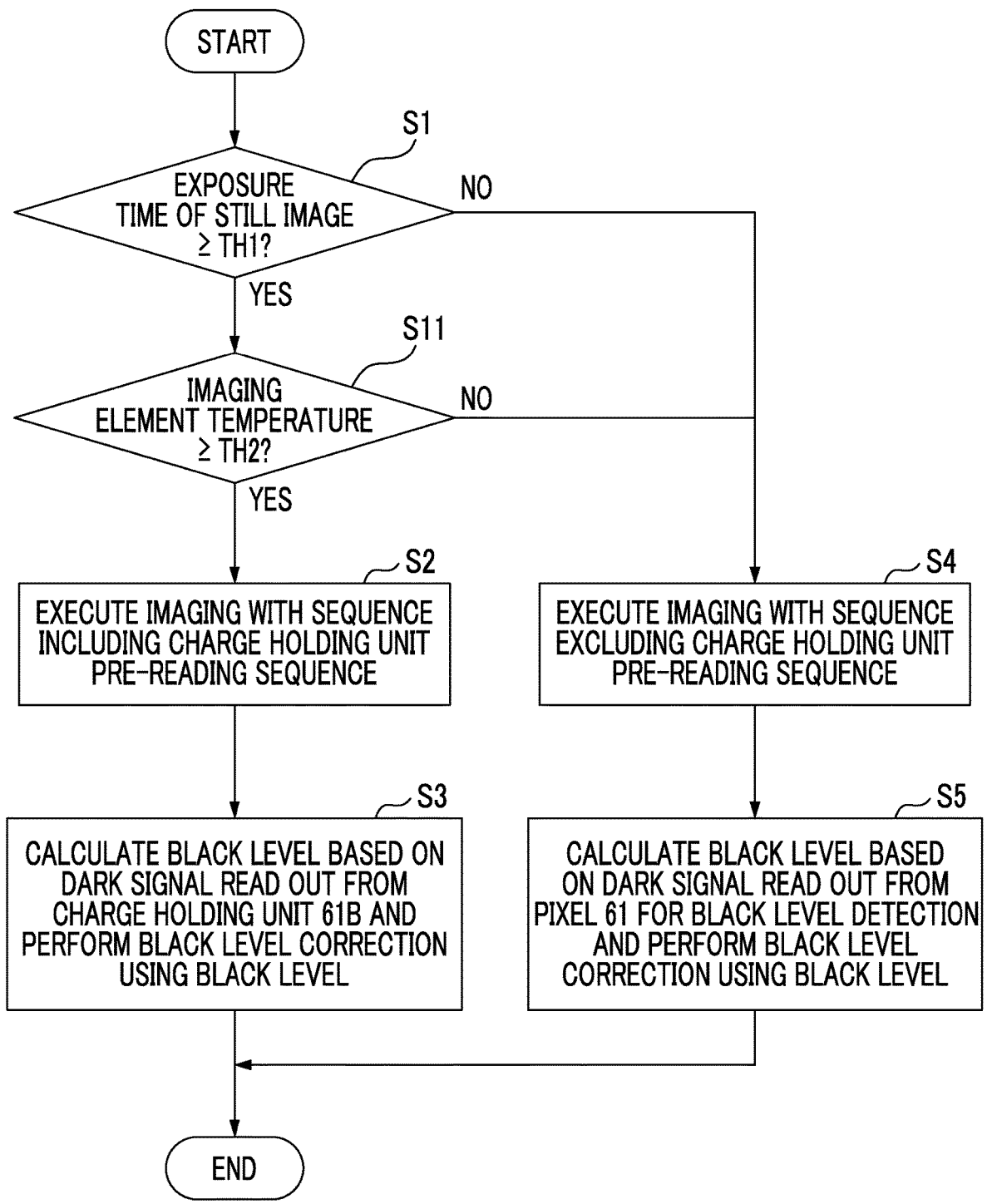
FIG. 9 is a flowchart for explaining the operation of the digital camera 100A illustrated in FIG. 8 in the still image capturing mode.

FIG. 9 is a flowchart for explaining the operation of the digital camera 100A illustrated in FIG. 8 in the still image capturing mode.

The flowchart illustrated in FIG. 9 is the same as the flowchart shown in FIG. 7 except that Step S11 is added. In FIG. 9, the same reference numerals are given to the same processes as those illustrated in FIG. 7, and the description thereof will be omitted.

In a case where the determination in Step S1 is YES, the system control unit 11 determines whether or not the temperature of the imaging element 5 detected by the temperature sensor 50 is equal to or higher than a threshold value TH2 (Step S11).

As the threshold value TH2, a lower limit value of the temperature is set, the temperature in which the difference between the first dark charge and the second dark charge becomes large and the reliability of the black level calculated using the first dark charge becomes insufficient.

In a case where it is determined that the temperature is equal to or higher than the threshold value TH2 (Step S11, YES), the system control unit 11 performs the process of Step S2 and in a case where it is determined that the temperature is lower than the threshold value TH2 (Step S11, NO), the system control unit 11 performs the process of Step S4.

As described above, according to the digital camera 100A, even in a case where the exposure time T is long to an extent that the charge holding unit pre-reading sequence PRE is executed, as long as the temperature of the imaging element 5 is not equal to or higher than the threshold value TH2, charge holding unit pre-reading sequence PRE is not executed. Therefore, power consumption can be reduced.

On the other hand, in a case where the temperature of the imaging element 5 is equal to or higher than the threshold value TH2, the charge holding unit pre-reading sequence PRE is executed, so that black level correction can be performed with high accuracy.

If the system has a configuration such that the exposure time T can only be set to be equal to or longer than the pre-read time, Step S1 in FIG. 9 is unnecessary.

A preferable example of a method in which the digital signal processing unit 17 calculates the black level using the dark image signal P1 will be described below.

The dark charge generated in the photoelectric conversion element 61A and the dark charge generated in the charge holding unit 61B are not strictly the same. Therefore, at the time of manufacturing the digital camera, information indicating the correlation between the first dark signal corresponding to the dark charge generated in the photoelectric conversion element 61A and the second dark signal corresponding to the dark charge generated in the charge holding unit 61B in a state where the imaging element 5 is shielded from light is generated and stored in the internal memory 17A.

Then, the digital signal processing unit 17 calculates the black level of the captured image signal P2 based on the information stored in the internal memory 17A and the dark image signal P1. The internal memory 17A constitutes a storage unit.

The information indicating the correlation is coefficients a and b in a function of "$y=ax+b$" in which the first dark signal corresponding to the dark charge generated in the photoelectric conversion element 61A is y and the second dark signal corresponding to the dark charge generated in the electric charge holding unit 61B is a variable x.

The coefficients a and b are calculated by as below. The first dark signal corresponding to the dark charge generated at a predetermined time in the photoelectric conversion element 61A having a predetermined effective pixel and the second dark signal corresponding to the dark charge generated at a predetermined time in the charge holding unit 61B having a predetermined effective pixel are measured by multiple times in a case where the digital cameras 100 and 100A are manufactured, in a state where the imaging element 5 is shielded from light and the temperature of the imaging element 5 is a predetermined temperature.

Then, the coefficients a and b of the function "y=ax+b" are calculated from the plurality of measured first dark signals and a plurality of second dark signals by a method of least squares or the like.

The function "y=ax+b" calculated in this manner is an arithmetic expression for converting a signal corresponding to the dark charge generated in the charge holding unit 61B into a signal corresponding to the dark charge generated in the photoelectric conversion element 61A. That is, by the arithmetic expression, it is possible to accurately calculate the black level of the imaging signal read out from the photoelectric conversion element 61A.

Figure 10:
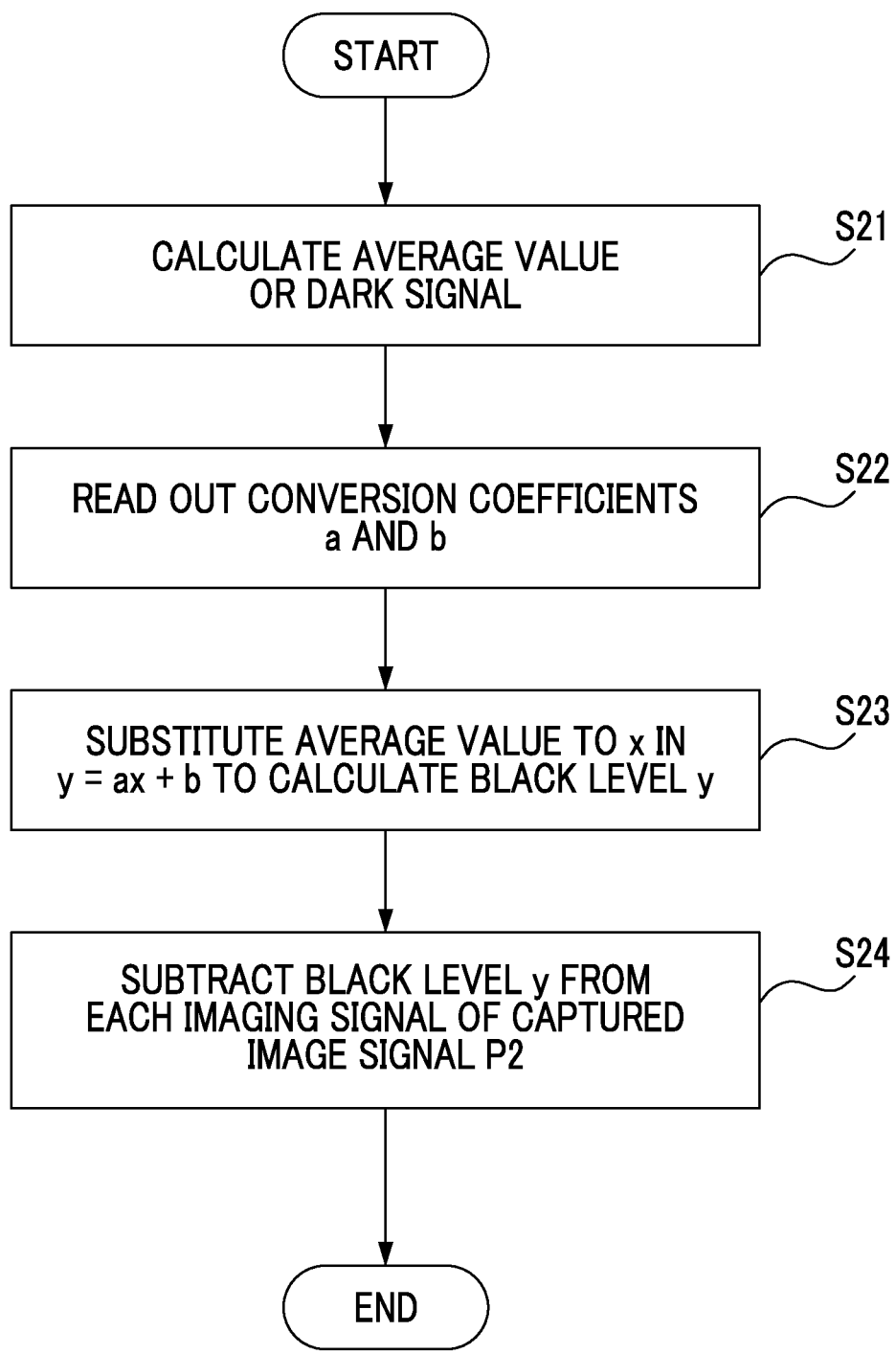
FIG. 10 is a flowchart illustrating details of step S3 shown in FIG. 7.

FIG. 10 is a flowchart illustrating details of step S3 shown in FIG. 7. In the process example of FIG. 10, it is assumed that coefficients a and b of the function "y=ax+b" are stored in the internal memory 17A.

First, the digital signal processing unit 17 calculates the average value of all the dark signals constituting the dark image signal P1 (Step S21).

Next, the digital signal processing unit 17 reads out the conversion coefficients a and b from the internal memory 17A (Step S22).

Next, the digital signal processing unit 17 substitutes the average value calculated in Step S21 into the variable x of the function "y=ax+b", and calculates the black level common to all effective pixels (Step S23).

In a case where the captured image signal P2 is stored in the internal memory 17A, the digital signal processing unit 17 subtracts the black level calculated in Step S23 from each imaging signal constituting the captured image signal P2 to perform black level correction (Step S34).

As described above, according to the black level correction process shown in FIG. 10, it is possible to improve the quality of captured image data by correcting the black level of the captured image signal P2 with high accuracy.

In Step S23, the digital signal processing unit 17 skips Step S21 and substitutes each dark signal of the dark image signal P1 into the variable x of the function "y=ax+b" to calculate black levels of a plurality of pixels 61.

In this case, in step S24, the digital signal processing unit 17 subtracts the black level corresponding to the pixel 61 from which each of the imaging signals is read out from each imaging signal constituting the captured image signal P2 to perform black level correction.

It is conceivable that the relationship between the first dark signal and the second dark signal measured at the time of manufacture of the digital camera also varies depending on the temperature or exposure time of the imaging element 5.

For this reason, a set for a plurality of times of measuring the first dark signal and the second dark signal may be performed a plurality of times while changing the predetermined time or the predetermined temperature, and coefficients a and b of the function "y=ax+b" are calculated and stored by each of a plurality of times or a plurality of temperatures.

In this case, in Step S22 of FIG. 10, the digital signal processing unit 17 reads out the conversion coefficients a and b corresponding to the temperature or the exposure time T of the imaging element 5, and in Step S23, the conversion coefficients a and b may be used to calculate the black level. Accordingly, it is possible to calculate the black level with higher accuracy.

Instead of calculating and storing reference conversion coefficients a and b by each of a plurality of times or a plurality of temperatures, the reference conversion coefficients a and b may be calculated at a reference time of exposure or a reference temperature of the imaging element 5 and stored in the internal memory 17A.

In this case, the relative value with respect to the reference time or the relative value with respect to the reference temperature and the correction information (numerical value indicating how much a and b are to be increased or decreased) of the reference conversion coefficients a and b are associated with each other to be stored in the internal memory 17A.

Then, the digital signal processing unit 17 calculates a difference between the temperature and the reference temperature of the imaging element 5 as a relative value, and reads out the correction information corresponding to this relative value and the reference conversion coefficients a and b in the internal memory 17A.

The digital signal processing unit 17 corrects the reference conversion coefficients a and b according to the read correction information and calculates the black level using the corrected reference conversion coefficients a and b.

Alternatively, the digital signal processing unit 17 calculates a difference between the exposure time T and the reference time of the imaging element 5 as a relative value, and reads out the correction information corresponding to this relative value and the reference conversion coefficients a and b in the internal memory 17A.

The digital signal processing unit 17 corrects the reference conversion coefficients a and b according to the read correction information and calculates the black level using the corrected reference conversion coefficients a and b.

The aforementioned measurement may be performed for each effective pixel of the imaging element 5, the coefficients a and b of the function "y=ax+b" may be calculated according to the measurement result, and the coefficients a and b may be stored in the internal memory 17A.

Since the generation state of dark charge differs for each effective pixel, by calculating the black level using the conversion coefficient corresponding to each effective pixel, the black level can be calculated with higher accuracy.

Figure 11:
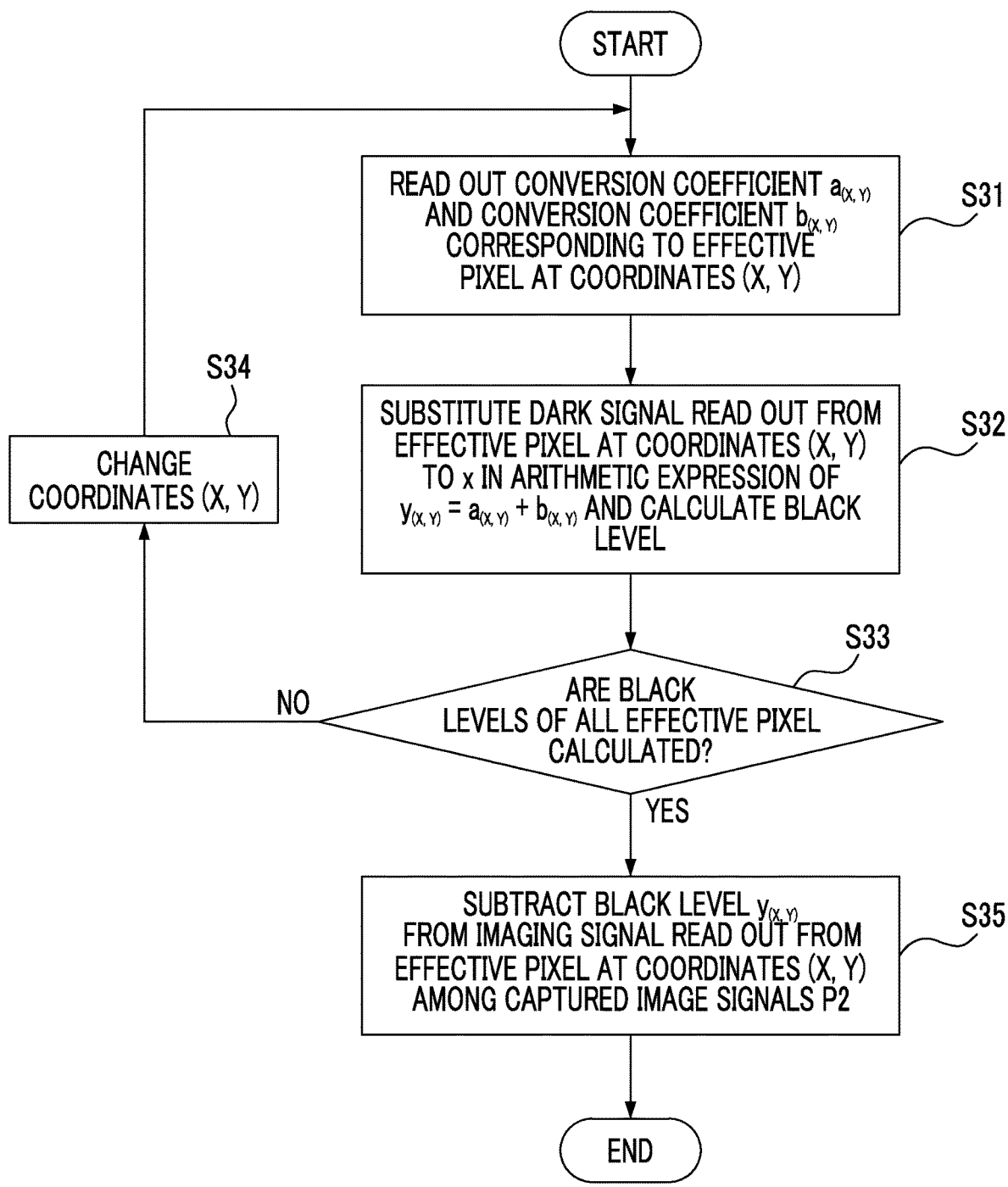
FIG. 11 is a flowchart illustrating a modification example of details of step S3 shown in FIG. 7.

FIG. 11 is a flowchart illustrating a modification example of details of step S3 shown in FIG. 7.

In the process example of FIG. 11, coefficients a and b of the function "y=ax+b" for every effective pixel included in the imaging element 5 are stored in the internal memory 17A.

It is to be noted that a position of the effective pixel arranged on the light reception surface 60 is described as the coordinates (X, Y), and the function corresponding to the effective pixel at coordinates (X, Y) is described as "$y_{(X, Y)} = a_{(X, Y)} x + b_{(X, Y)}$".

First, the digital signal processing unit 17 reads out the conversion coefficient $a_{(X, Y)}$ and the conversion coefficient $b_{(X, Y)}$ corresponding to the effective pixel at the coordinates (X, Y) from the internal memory 17A (Step S31).

Next, the digital signal processing unit 17 substitutes the dark signal read out from the effective pixels at the coordinates (X, Y) among the dark image signal P1 into the variable x of the function "$y_{(X, Y)} = a_{(X, Y)} x + b_{(X, Y)}$" to calculate the black level $y_{(X, Y)}$ corresponding to the effective pixel at the coordinates (X, Y) (Step S32).

In a case where the black level is not calculated for all the effective pixels (Step S33, NO), the digital signal processing unit 17 changes the coordinates (X, Y) of the effective pixel to another value in Step S34 and returns the process to Step S31. By repeating the processes from Step S31 to Step S34, the black level is calculated for all effective pixels.

In the black level calculation for all effective pixels (Step S33, YES), in a case where the captured image signal P2 is stored in the internal memory 17A, the digital signal processing unit 17 subtracts the black level $y_{(X, Y)}$ corresponding to the effective pixel from the imaging signal read out from the effective pixel at the coordinates (X, Y) among the captured image signal P2 to perform black level correction (Step S35).

As described above, according to the black level correction processing shown in FIG. 11, it is possible to calculate the black level with high accuracy for each effective pixel by using the conversion coefficients generated for each effective pixel. Therefore, it is possible to improve the quality of the captured image data by correcting the black level of the captured image signal P2 with high accuracy.

Also in the black level correction processing shown in FIG. 11, it is preferable to obtain conversion coefficients corresponding to each effective pixel for each temperature or exposure time of the imaging element 5 and to store the conversion coefficients in the internal memory 17A.

In this case, the digital signal processing unit 17 reads out a conversion coefficient $a_{(X, Y)}$ and a conversion coefficient $b_{(X, Y)}$ corresponding to the exposure time T or the temperature of the imaging element 5 among the conversion coefficients corresponding to the effective pixels at the coordinates (X, Y) in Step S31 shown in FIG. 11, and calculates the black level using the conversion coefficient $a_{(X,Y)}$ and a conversion coefficient $b_{(X, Y)}$ in Step S32. Accordingly, it is possible to calculate the black level with higher accuracy.

Further, for each effective pixel, the reference conversion coefficients a and b are calculated with respect to the reference time of exposure or the reference temperature of the imaging element 5, and are stored in the internal memory 17A. Furthermore, relative values with respect to the reference time or the relative value with respect to the reference temperature and the correction information on the reference conversion coefficients a and b may be stored in the internal memory 17A in association with each other.

In this case, the digital signal processing unit 17 calculates the difference between the temperature of the imaging element 5 and the reference temperature as a relative value, and reads out the correction information corresponding to the relative value among the correction information corresponding to the effective pixels of which black levels are to be calculated, and the reference conversion coefficients a and b corresponding to the effective pixels of which black levels are to be calculated from the internal memory 17A.

The digital signal processing unit 17 corrects the reference conversion coefficients a and b according to the read correction information and calculates the black level of the effective pixels of which black levels are to be calculated using the corrected reference conversion coefficients a and b.

In this case, the digital signal processing unit 17 calculates the difference between the exposure time T of the imaging element 5 and the reference time as a relative value, and reads out the correction information corresponding to the relative value among the correction information corresponding to the effective pixels of which black levels are to be calculated, and the reference conversion coefficients a and b corresponding to the effective pixels of which black levels are to be calculated from the internal memory 17A.

The digital signal processing unit 17 corrects the reference conversion coefficients a and b according to the read correction information and calculates the black level of the effective pixels of which black levels are to be calculated using the corrected reference conversion coefficients a and b.

In the digital cameras 100 and 100A, the global reset driving and the global shutter driving are performed in the still image exposure sequence EX, so that exposure is performed simultaneously on all the pixels 61. However, the present invention is not limited thereto.

Figure 12:
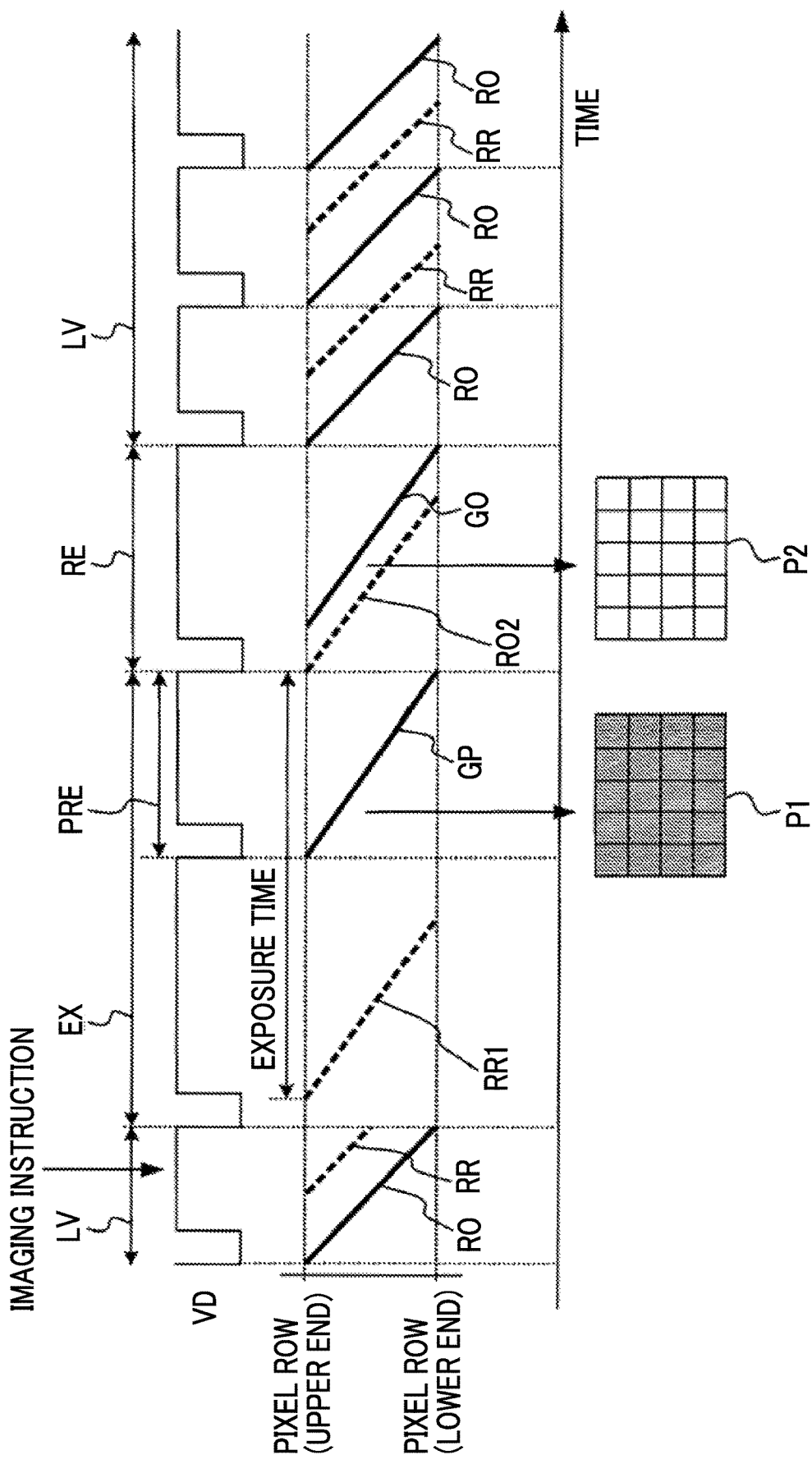
FIG. 12 is a diagram illustrating a modification example of the timing chart illustrated in FIG. 5.

FIG. 12 is a diagram illustrating a modification example of the timing chart illustrated in FIG. 5.

For example, as shown by a straight line RR1 in FIG. 12, the system control unit 11 performs rolling reset driving in the still image exposure sequence EX to sequentially start exposure for each pixel row 62. Thereafter, as indicated by the straight line RO2, the system control unit 11 drives the charge transfer unit 61C of each pixel 61 in the pixel row 62 and transfers the imaging charge accumulated in the photoelectric conversion element 61A of each pixel 61 to the charge holding unit 61B while changing the pixel rows 62 sequentially, and exposure for each pixel row 62 ends sequentially.

According to the configuration, in each pixel row 62, the time from resetting of the charge holding unit 61B until the dark signal corresponding to the dark charge generated in the charge holding unit 61B is read out is constant. Therefore, the black level can be obtained with higher accuracy.

The digital camera has been described as an example of the imaging device so far. Hereinafter, an embodiment of a smartphone with a camera will be described as the imaging device.

Figure 13:
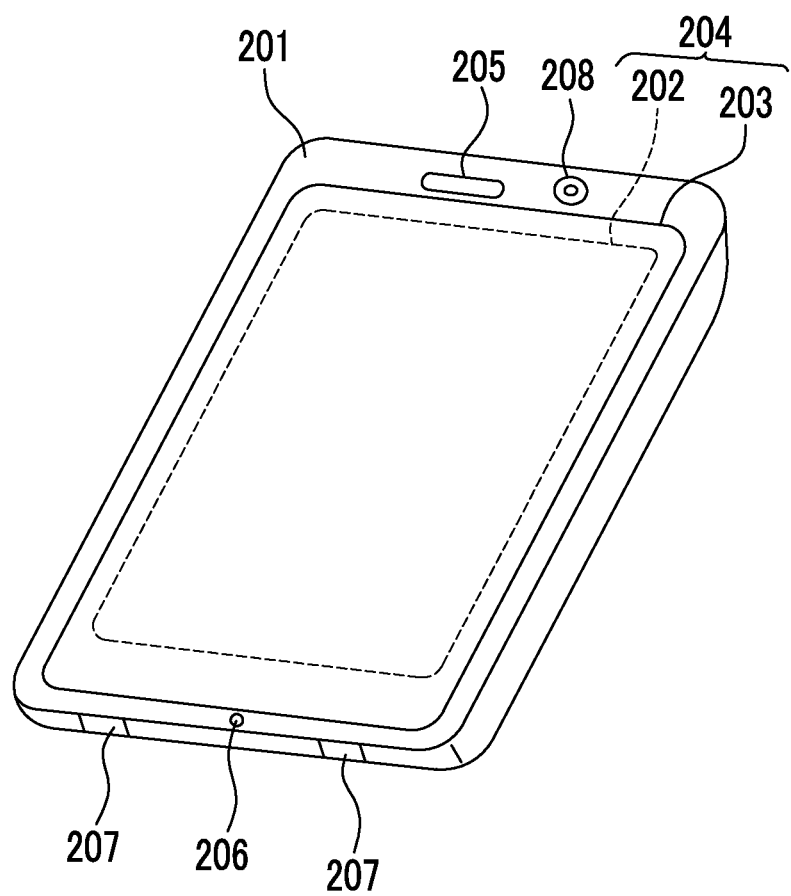
FIG. 13 illustrates an appearance of a smartphone 200 which is an embodiment of the imaging device of the present invention.

FIG. 13 illustrates an appearance of a smartphone 200 which is an embodiment of the imaging device of the present invention.

The smartphone 200 illustrated in FIG. 13 has a flat casing 201, and comprises a display input unit 204 in which a display panel 202 as a display unit and a manipulation panel 203 as an input unit are integrally formed on one surface of the casing 201.

Further, such a casing 201 comprises a speaker 205, a microphone 206, a manipulation unit 207, and a camera unit 208.

It should be noted that a configuration of the casing 201 is not limited thereto. For example, a configuration in which the display unit and the input unit are independent can be adopted, or a configuration having a folding structure or a sliding mechanism can be adopted.

Figure 14:
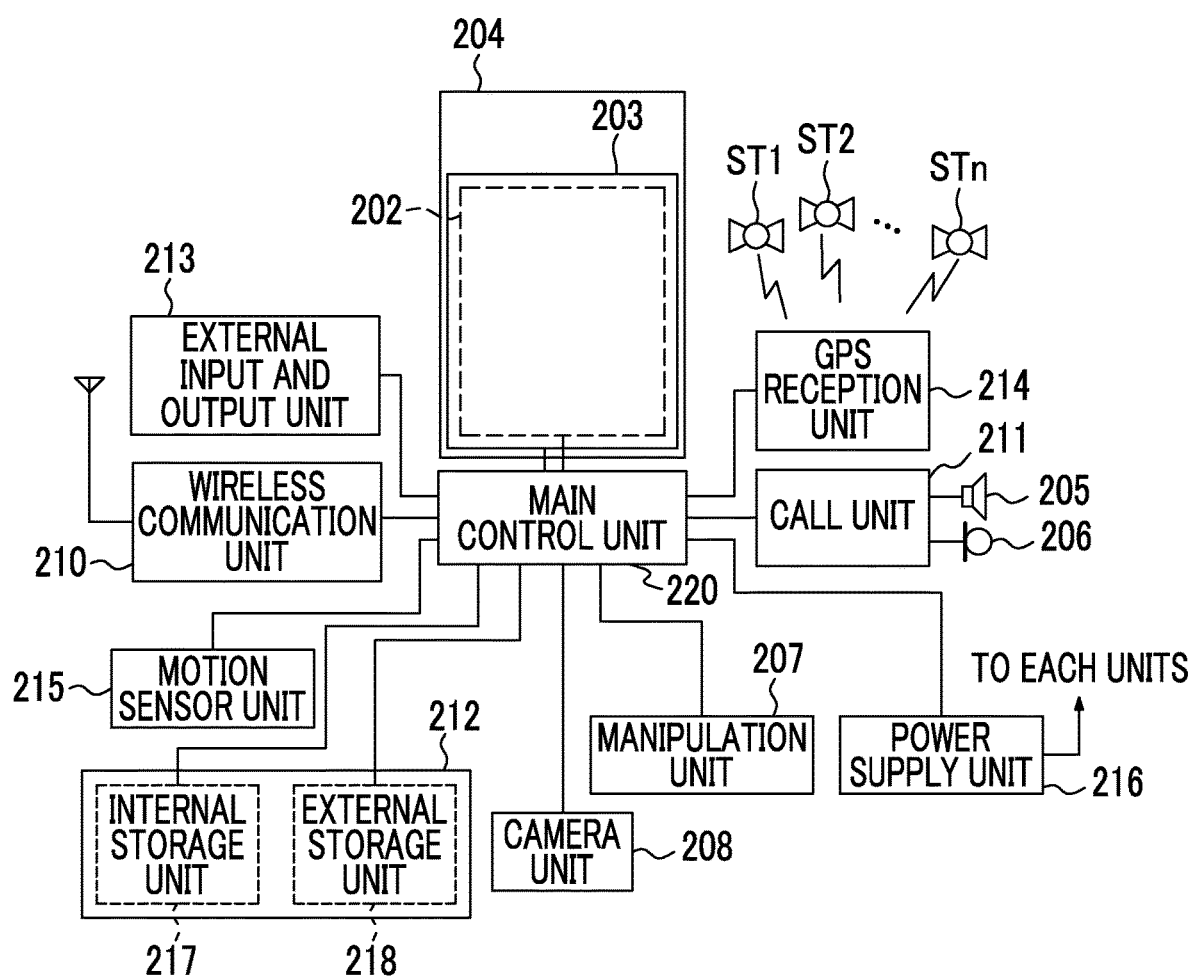
FIG. 14 is a block diagram illustrating a configuration of the smartphone 200 illustrated in FIG. 13.

FIG. 14 is a block diagram illustrating a configuration of the smartphone 200 illustrated in FIG. 13.

As illustrated in FIG. 14, the smartphone comprises, as main components, a wireless communication unit 210, a display input unit 204, a call unit 211, a manipulation unit 207, a camera unit 208, a storage unit 212, an external input and output unit 213, a global positioning system (GPS) reception unit 214, a motion sensor unit 215, a power supply unit 216, and a main control unit 220.

In addition, the smartphone 200 has, as a main function, a wireless communication function of performing mobile wireless communication via a base station device BS (not shown) and a mobile communication network NW (not shown).

The wireless communication unit 210 performs wireless communication with the base station device BS accommodated in the mobile communication network NW according to an instruction from the main control unit 220. Using the wireless communication, the wireless communication unit 210 performs transmission and reception of various types of file data such as audio data and image data, e-mail data, or the like, or reception of web data, streaming data, or the like.

The display input unit 204 is a so-called touch panel that displays an image (a still image or a moving image), text information, or the like to visually transfer information to the user, and detects a user manipulation with respect to the displayed information under the control of the main control unit 220, and comprises a display panel 202 and a manipulation panel 203.

For the display panel 202, a liquid crystal display (LCD), an organic electro-luminescence display (OELD), or the like is used as a display device.

The manipulation panel 203 is a device that is placed so that an image displayed on the display surface of the display panel 202 can be visually recognized, and detects one or a plurality of coordinates, which is manipulated by a finger of a user or a stylus. In a case in which this device is manipulated by the finger of the user or the stylus, a detection signal generated due to the manipulation is output to the main control unit 220. Then, the main control unit 220 detects a manipulation position (coordinates) on the display panel 202 based on the received detection signal.

As illustrated in FIG. 13, the display panel 202 and the manipulation panel 203 of the smartphone 200 illustrated as an embodiment of the imaging device of the present invention are integrated to constitute the display input unit 204, but the manipulation panel 203 is disposed to completely cover the display panel 202.

In a case in which such a disposition has been adopted, the manipulation panel 203 may also have a function of detecting a user manipulation in an area outside the display panel 202. In other words, the manipulation panel 203 may include a detection area (hereinafter referred to as a display area) for an overlapping portion overlapping the display panel 202, and a detection area (hereinafter referred to as a non-display area) for an outer edge portion not overlapping the display panel 202 other than the display area.

It should be noted that although a size of the display area may perfectly match a size of the display panel 202, it is not always necessary to match the size of the display area with the size of the display panel 202. In addition, the manipulation panel 203 may include two sensitive areas including an outer edge portion and an inner portion other than the outer edge portion. Further, a width of the outer edge portion is appropriately designed according to a size of the casing 201, or the like.

Furthermore, examples of a position detection scheme adopted in the manipulation panel 203 may include a matrix switching scheme, a resistive film scheme, a surface acoustic wave scheme, an infrared scheme, an electromagnetic induction scheme, and a capacitive scheme, and any one of the schemes can also be adopted.

The call unit 211 comprises a speaker 205 or a microphone 206, converts a voice of the user input through the microphone 206 into audio data that can be processed by the main control unit 220, and outputs the audio data to the main control unit 220 or decodes audio data received by the wireless communication unit 210 or the external input and output unit 213 and outputs the decoded audio data from the speaker 205.

Further, as illustrated in FIG. 13, for example, the speaker 205 can be mounted on the same surface as a surface on which the display input unit 204 is provided, and the microphone 206 can be mounted on a side surface of the casing 201.

The manipulation unit 207 is a hardware key using a key switch or the like, and receives an instruction from the user. For example, as illustrated in FIG. 13, the manipulation unit 207 is a push button type switch that is mounted on the side surface of the casing 201 of the smartphone 200, is turned on in a case in which the manipulation unit 207 is pressed by a finger or the like, and is turned off by a restoring force of a spring or the like in a case in which the finger is released.

The storage unit 212 stores a control program or control data of the main control unit 220, application software, address data associating a name, a telephone number, or the like of a communication partner, transmitted or received data of an e-mail, web data downloaded by web browsing, and downloaded content data, and temporarily stores streaming data or the like. Further, the storage unit 212 includes an internal storage unit 217 built in the smartphone and an external storage unit 218 having a slot for detachable external memory.

It should be noted that the internal storage unit 217 and the external storage unit 218 constituting the storage unit 212 are realized by a storage medium such as a flash memory type, hard disk type, multimedia card micro type, or card type of memory (for example, a MicroSD (registered trademark) memory), a random access memory (RAM), or a read only memory (ROM).

The external input and output unit 213 serves as an interface with all external devices connected to the smartphone 200, and is a unit for direct or indirect connection to other external devices through communication (for example, universal serial bus (USB) or IEEE 1394) or a network (for example, the Internet, a wireless LAN, Bluetooth (registered trademark), radio frequency identification (RFID), infrared communication (infrared data association: IrDA) (registered trademark), ultra wide band (UWB) (registered trademark), or ZigBee (registered trademark)).

Examples of the external devices connected to the smartphone 200 include a wired/wireless headset, a wired/wireless external charger, a wired/wireless data port, a memory card or a subscriber identity module (SIM)/user identity module (UIM) card connected via a card socket, an external audio and video device connected via an audio and video input/output (I/O) terminal, an external audio and video device that is connected wirelessly, a smartphone connected by a cable/wirelessly, a personal computer connected by a cable/wirelessly, a PDA connected by a cable/wirelessly, and an earphone connected by a cable/wirelessly.

The external input and output unit 213 transfers data transmitted from such an external device to internal components of the smartphone 200 or transfers data inside the smartphone 200 to the external device.

According to an instruction from the main control unit 220, the GPS reception unit 214 receives GPS signals transmitted from GPS satellites ST1 to STn, and executes a positioning arithmetic process based on the plurality of received GPS signals to detect a position represented by the latitude, longitude, and altitude of the smartphone 200.

In a case in which position information can be acquired from the wireless communication unit 210 or the external input and output unit 213 (for example, a wireless LAN), the GPS reception unit 214 can also detect the position using the position information.

The motion sensor unit 215 comprises, for example, a triaxial acceleration sensor or the like, and detects a physical movement of the smartphone 200 according to an instruction from the main control unit 220. By detecting the physical movement of the smartphone 200, a moving direction or an acceleration of the smartphone 200 is detected. A result of the detection is output to the main control unit 220.

The power supply unit 216 supplies power accumulated in a battery (not illustrated) to each unit of the smartphone 200 according to an instruction from the main control unit 220.

The main control unit 220 comprises a microprocessor, operates according to a control program or control data stored in the storage unit 212, and totally controls each unit of the smartphone 200.

In addition, the main control unit 220 has a mobile communication control function of controlling each unit of the communication system and an application processing function in order to perform audio communication or data communication through the wireless communication unit 210.

The application processing function is realized by the main control unit 220 operating according to the application software stored in the storage unit 212.

Examples of the application processing function include an infrared communication function of controlling the external input and output unit 213 to perform data communication with an opposite device, an e-mail function of transmitting and receiving an e-mail, and a web browsing function of browsing a web page.

Further, the main control unit 220 has an image processing function such as displaying an image on the display input unit 204 based on image data (data of a still image or moving image) such as received data or downloaded streaming data.

The image processing function is a function of the main control unit 220 decoding the image data, applying image processing to a result of the decoding, and displaying the image on the display input unit 204.

Further, the main control unit 220 executes display control for the display panel 202 and manipulation detection control for detecting a user manipulation through the manipulation unit 207 and manipulation panel 203. Through the execution of the display control, the main control unit 220 displays a window for displaying a software key such as an icon or a scroll bar for activating application software or creating an e-mail.

It should be noted that, with respect to, for example, a large image which does not fit to a display area of the display panel 202, the scroll bar is a software key for receiving an instruction to move a display unit of an image.

Further, through execution of the manipulation detection control, the main control unit 220 detects a user manipulation through the manipulation unit 207, receives a manipulation with respect to the icon or an input of a character string to an input field of the window through the manipulation panel 203, or receives a scroll request of a display image through the scroll bar.

Furthermore, through the execution of the manipulation detection control, the main control unit 220 has a touch panel control function of determining whether a manipulation position with respect to the manipulation panel 203 is in the overlapping portion (the display area) overlapping the display panel 202 or in the outer edge portion (the non-display area) not overlapping the display panel 202, other than the display area, and controlling a sensitive area of the manipulation panel 203 or a display position of the software key.

Further, the main control unit 220 can detect a gesture manipulation with respect to the manipulation panel 203 and execute a preset function according to the detected gesture manipulation. The gesture manipulation is not a simple touch manipulation in the related art, but is a manipulation for drawing a trajectory with respect to at least one of a plurality of positions by drawing a trajectory with a finger or the like, by designating a plurality of positions simultaneously, or in a combination thereof.

The camera unit 208 includes configurations other than the external memory control unit 20, the storage medium 21, the display driver 22, the display unit 23, and the manipulation unit 14 in the digital camera illustrated in FIG. 1.

The captured image data generated by the camera unit 208 can be stored in the storage unit 212 or output via the external input and output unit 213 or the wireless communication unit 210.

In the smartphone 200 illustrated in FIG. 13, the camera unit 208 is mounted on the same surface as the surface on which the display input unit 204 is provided, but a mounting position of the camera unit 208 is not limited thereto and the camera unit 208 may be mounted on a rear surface of the display input unit 204.

In addition, the camera unit 208 can be used for various functions of the smartphone 200. For example, an image acquired by the camera unit 208 can be displayed on the display panel 202. The image of the camera unit 208 can be used as one of manipulation inputs of the manipulation panel 203.

Further, in a case in which the GPS reception unit 214 detects the position, the GPS reception unit 214 can detect the position by referring to the image from the camera unit 208. Further, by referring to the image from the camera unit 208, it is possible to determine an optical axis direction of the camera unit 208 of the smartphone 200 without using a triaxial acceleration sensor or in combination with the triaxial acceleration sensor or determine a current use environment. It is obvious that the image from the camera unit 208 can be used in application software.

In addition, the position information acquired by the GPS reception unit 214, the audio information acquired by the microphone 206 (which may be text information obtained through audio-text conversion in the main control unit or the like), the posture information acquired by the motion sensor unit 215, or the like may be added to the image data of the still image or the moving image and stored in the storage unit 212 or output via the external input and output unit 213 or the wireless communication unit 210.

As described above, the following matters are disclosed in the present specification.

(1) An imaging device comprising: a MOS type imaging element including a plurality of pixels including a photoelectric conversion element which receives light and accumulates charge, a charge holding unit which is shielded from light and holds the charge accumulated in the photoelectric conversion element, and a floating diffusion to which the charge is transferred from the charge holding unit, wherein a signal corresponding to a potential of the floating diffusion is read out by a readout circuit; a driving control unit performing a first driving control by which the photoelectric conversion element and the charge holding unit of the pixel are reset to start the exposure of the photoelectric conversion element, and an imaging charge accumulated in the photoelectric conversion element is transferred to the charge holding unit of the pixel to end the exposure, a second driving control by which the readout circuit reads out a signal corresponding to a dark charge held by the charge holding unit before the imaging charge is transferred to the charge holding unit by the first driving control, and a third driving control by which the readout circuit reads out the signal corresponding to the imaging charge held by the charge holding unit after the exposure ends by the first driving control; and an image processing unit generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

(2) The imaging device according (1), in which the image processing unit calculates a black level of the captured image signal based on the dark image signal, and performs a black level correction of the captured image signal based on the black level.

(3) The imaging device according to (2), further comprising: a storage unit storing information indicating a correlation between a first dark signal corresponding to a dark charge generated in the photoelectric conversion element and a second dark signal corresponding to a dark charge generated in the charge holding unit, in a state where the imaging element is shielded from light, in which the image processing unit calculates the black level based on the dark image signal and the information indicating the correlation.

(4) The imaging device according to (3), in which the information indicating the correlation is a coefficient of a function representing the first dark signal using the second dark signal as a variable, and in which the image processing unit calculates the black level by an arithmetic operation in which an average value of signals constituting the dark image signal or each of the signals constituting the dark image signal is set as a variable of the function.

(5) The imaging device according to (4), in which the coefficient is stored in the storage unit in association with each of the plurality of pixels, and in which the image processing unit calculates the black level for each of the plurality of pixels by an arithmetic operation in which each signal constituting the dark image signal is set as a variable of the function and the coefficient corresponding to the pixel from which each of the signals is read out is set as a coefficient of the function.

(6) The imaging device according to any one of (3) to (5), in which the information is stored in the storage unit in association with each exposure time or each temperature of the imaging element, and in which the image processing unit calculates the black level using the information corresponding to the exposure time or the temperature of the imaging element.

(7) The imaging device according to any one of (3) to (5), in which the storage unit stores the information in association with a reference exposure time or a reference temperature of the imaging element, and further stores a relative value of the exposure time or the temperature of the imaging element with respect to the reference time or the reference temperature and correction information for correcting the information in association with each other, and in which the image processing unit obtains a relative value of the exposure time or the temperature of the imaging element with respect to the reference time or the reference temperature, corrects the information by the correction information corresponding to the relative value, and calculates the black level using the corrected information.

(8) The imaging device according to any one of (1) to (7), in which, in a case where the exposure time is shorter than a threshold value, the driving control unit skips the second driving control and performs the first driving control and the third driving control.

(9) The imaging device according to (8), in which the threshold value is a time required for reading out a signal corresponding to the dark charge from each of the plurality of pixels by the second driving control.

(10) The imaging device according to any one of (1) to (9), further comprising: a temperature sensor for detecting a temperature of the imaging element, in which in a case where the temperature of the imaging element is lower than a threshold value, the driving control unit skips the second driving control and performs the first driving control and the third driving control.

(11) An imaging method of imaging an subject with a MOS type imaging element including a plurality of pixels including a photoelectric conversion element which receives light and accumulates charge, a charge holding unit which is shielded from light and holds the charge accumulated in the photoelectric conversion element, and a floating diffusion to which the charge is transferred from the charge holding unit, wherein a signal corresponding to a potential of the floating diffusion is read out by a readout circuit, the method comprising: a driving control step of performing a first driving control by which the photoelectric conversion element and the charge holding unit of the pixel are reset to start the exposure of the photoelectric conversion element, and an imaging charge accumulated in the photoelectric conversion element is transferred to the charge holding unit of the pixel to end the exposure, a second driving control by which the readout circuit reads out a signal corresponding to a dark charge held by the charge holding unit before the imaging charge is transferred to the charge holding unit by the first driving control, and a third driving control by which the readout circuit reads out the signal corresponding to the imaging charge held by the charge holding unit after the exposure ends by the first driving control; and an image processing step of generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

(12) The imaging method according to (11), in which in the image processing step, a black level of the captured image signal is calculated based on the dark image signal, and a black level correction of the captured image signal is performed based on the black level.

(13) The imaging method according to (12), in which in the image processing step, the black level is calculated based on the dark image signal and information read out from the storage unit storing the information indicating a correlation between a first dark signal corresponding to a dark charge generated in the photoelectric conversion element and a second dark signal corresponding to a second dark charge generated in the charge holding unit, in a state where the imaging element is shielded from light.

(14) The imaging method according to (13), in which the information indicating the correlation is a coefficient of a function representing the first dark signal using the second dark signal as a variable, and in which in the image processing step, the black level is calculated by an arithmetic operation in which each signal constituting the dark image signal is set as a variable of the function.

(15) The imaging method according to (14), in which the coefficient is stored in the storage unit in association with each of the plurality of pixels, and in which in the image processing step, the black level is calculated by an arithmetic operation in which each signal constituting the dark image signal is set as a variable of the function and the coefficient corresponding to the pixel from which each of the signals is read out is set as a coefficient of the function.

(16) The imaging method according to any one of (13) to (15), in which the information is stored in the storage unit in association with each exposure time or each temperature of the imaging element, and in which in the image processing step, the black level is calculated using the information corresponding to the exposure time or the temperature of the imaging element.

(17) The imaging method according to any one of (13) to (15), in which the storage unit stores the information in association with a reference exposure time or a reference temperature of the imaging element, and further stores a relative value of the exposure time or the temperature of the imaging element with respect to the reference time or the reference temperature and correction information for correcting the information in association with each other, and in which in the image processing step, a relative value of the exposure time or the temperature of the imaging element with respect to the reference time or the reference temperature is obtained, the information is corrected by the correction information corresponding to the relative value, and the black level is calculated using the corrected information.

(18) The imaging method according to any one of (11) to (17), in which, in the driving control step, in a case where the exposure time is shorter than a threshold value, the second driving control is skipped and the first driving control and the third driving control are performed.

(19) The imaging method according to (18), in which the threshold value is a time required for reading out a signal corresponding to the dark charge from each of the plurality of pixels by the second driving control.

(20) The imaging method according to any one of (11) to (19), further comprising: a step of detecting a temperature of the imaging element, in which in the driving control step, in a case where the temperature of the imaging element is lower than a threshold value, the second driving control is skipped and the first driving control and the third driving control are performed.

(21) An imaging program for imaging an subject with a MOS type imaging element including a plurality of pixels including a photoelectric conversion element which receives light and accumulates charge, a charge holding unit which is shielded from light and holds the charge accumulated in the photoelectric conversion element, and a floating diffusion to which the charge is transferred from the charge holding unit, wherein a signal corresponding to a potential of the floating diffusion is read out by a readout circuit, the program causing a computer to execute: a driving control step of performing a first driving control by which the photoelectric conversion element and the charge holding unit of the pixel are reset to start the exposure of the photoelectric conversion element, and an imaging charge accumulated in the photoelectric conversion element is transferred to the charge holding unit of the pixel to end the exposure, a second driving control by which the readout circuit reads out a signal corresponding to a dark charge held by the charge holding unit before the imaging charge is transferred to the charge holding unit by the first driving control, and a third driving control by which the readout circuit reads out the signal corresponding to the imaging charge held by the charge holding unit after the exposure ends by the first driving control; and an image processing step of generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

According to the present invention, it is possible to provide an imaging device, an imaging method, and an imaging program capable of obtaining information on a dark current generated in a photoelectric conversion element with high precision without performing imaging in a state where an imaging element is shielded from light.

Although the present invention has been described with reference to specific embodiments, the present invention is not limited to the embodiments, and various modifications are possible without departing from the technical spirit of the disclosed invention.

This application is based on Japanese patent application (JP2016-221759) filed Nov. 14, 2016, the content of which is incorporated herein.

EXPLANATION OF REFERENCES 100 digital camera
1 imaging lens
2 stop
4 lens control unit
5 imaging element
8 lens driving unit
9 stop driving unit
10 imaging element driving unit
11 system control unit
14 manipulation unit
17 digital signal processing unit
17A internal memory
20 external memory control unit
21 storage medium
22 display driver
23 display unit
24 control bus
25 data bus
40 lens device
60 light reception surface
61 pixel
61A photoelectric conversion element
61B charge holding unit
61C charge transfer unit
61D floating diffusion
61E readout circuit
62 pixel row
63 driving circuit
64 signal processing circuit
65 signal line
70 N-type substrate
71 P-well layer
72 reading electrode
73 N-type impurity layer
74 P-type impurity layer
75 area
76 transfer electrode
77 reset transistor
78 output transistor
79 selection transistor X row direction
Y column direction
LV live view sequence
EX still image exposure sequence
PRE charge holding unit pre-reading sequence
RE still image reading sequence
RR, GR straight line indicating reset timing
RO straight line indicating exposure end and signal read timing
GP straight line indicating signal read timing
GS straight line indicating exposure end timing
GO straight line indicating signal read timing
P1 dark image signal
P2 captured image signal
100A digital camera
50 temperature sensor
RR1 straight line indicating reset timing
RO2 straight line indicating exposure end timing
200 smartphone
201 casing
202 display panel
203 manipulation panel
204 display input unit
205 speaker
206 microphone
207 manipulation unit
208 camera unit
210 wireless communication unit
211 call unit
212 storage unit
213 external input and output unit
214 GPS reception unit
215 motion sensor unit
216 power supply unit
217 internal storage unit
218 external storage unit
220 main control unit
ST1 to STn GPS satellite

What is claimed is:

1. An imaging device comprising:
a MOS type imaging element comprising a plurality of pixels comprising a photoelectric conversion element which receives light and accumulates charge, a charge holding unit which is shielded from light and holds the charge accumulated in the photoelectric conversion element, and a floating diffusion to which the charge is transferred from the charge holding unit, wherein a signal corresponding to a potential of the floating diffusion is read out by a readout circuit;
a driving control unit performing
a first driving control by which the photoelectric conversion element and the charge holding unit of the pixel are reset to start an exposure of the photoelectric conversion element, and an imaging charge accumulated in the photoelectric conversion element is transferred to the charge holding unit of the pixel to end the exposure,
a second driving control by which the readout circuit reads out a signal corresponding to a dark charge held by the charge holding unit before the imaging charge is transferred to the charge holding unit by the first driving control, and
a third driving control by which the readout circuit reads out the signal corresponding to the imaging charge held by the charge holding unit after the exposure ends by the first driving control; and an image processing unit generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

2. The imaging device according to claim 1,
wherein the image processing unit calculates a black level of the captured image signal based on the dark image signal, and performs a black level correction of the captured image signal based on the black level.

3. The imaging device according to claim 2, further comprising:
a storage unit storing information indicating a correlation between a first dark signal corresponding to a dark charge generated in the photoelectric conversion element and a second dark signal corresponding to a second dark charge generated in the charge holding unit, in a state where the imaging element is shielded from light,
wherein the image processing unit calculates the black level based on the dark image signal and the information indicating the correlation.

4. The imaging device according to claim 3,
wherein the information indicating the correlation is a coefficient of a function representing the first dark signal using the second dark signal as a variable, and
wherein the image processing unit calculates the black level by an arithmetic operation in which an average value of signals constituting the dark image signal or each of the signals constituting the dark image signal is set as a variable of the function.

5. The imaging device according to claim 4,
wherein the coefficient is stored in the storage unit in association with each of the plurality of pixels, and
wherein the image processing unit calculates the black level for each of the plurality of pixels by an arithmetic operation in which each of the signals constituting the dark image signal is set as a variable of the function and the coefficient corresponding to the pixel from which each of the signals constituting the dark image signal is read out is set as a coefficient of the function.

6. The imaging device according to claim 3,
wherein the information is stored in the storage unit in association with each time of the exposure or each temperature of the imaging element, and
wherein the image processing unit calculates the black level using the information corresponding to the time of the exposure or the temperature of the imaging element.

7. The imaging device according to claim 3,
wherein the storage unit stores the information in association with a reference time of the exposure or a reference temperature of the imaging element, and further stores a relative value of the time of the exposure or the temperature of the imaging element with respect to the reference time or the reference temperature and correction information for correcting the information in association with each other, and
wherein the image processing unit obtains a relative value of the time of the exposure or the temperature of the imaging element with respect to the reference time or the reference temperature, corrects the information by the correction information corresponding to the relative value, and calculates the black level using the corrected information.

8. The imaging device according to claim 1,
wherein, in a case where the time of the exposure is shorter than a threshold value, the driving control unit skips the second driving control and performs the first driving control and the third driving control.

9. The imaging device according to claim 8,
wherein the threshold value is a time required for reading out a signal corresponding to the dark charge from each of the plurality of pixels by the second driving control.

10. The imaging device according to claim 1, further comprising:
a temperature sensor for detecting a temperature of the imaging element,
wherein in a case where the temperature of the imaging element is lower than a threshold value, the driving control unit skips the second driving control and performs the first driving control and the third driving control.

11. An imaging method of imaging an subject with a MOS type imaging element including a plurality of pixels including a photoelectric conversion element which receives light and accumulates charge, a charge holding unit which is shielded from light and holds the charge accumulated in the photoelectric conversion element, and a floating diffusion to which the charge is transferred from the charge holding unit, wherein a signal corresponding to a potential of the floating diffusion is read out by a readout circuit, the method comprising:
a driving control step of performing
a first driving control by which the photoelectric conversion element and the charge holding unit of the pixel are reset to start an exposure of the photoelectric conversion element, and an imaging charge accumulated in the photoelectric conversion element is transferred to the charge holding unit of the pixel to end the exposure,
a second driving control by which the readout circuit reads out a signal corresponding to a dark charge held by the charge holding unit before the imaging charge is transferred to the charge holding unit by the first driving control, and
a third driving control by which the readout circuit reads out the signal corresponding to the imaging charge held by the charge holding unit after the exposure ends by the first driving control; and
an image processing step of generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

12. The imaging method according to claim 11,
wherein in the image processing step, a black level of the captured image signal is calculated based on the dark image signal, and a black level correction of the captured image signal is performed based on the black level.

13. The imaging method according to claim 12,
wherein in the image processing step, the black level is calculated based on the dark image signal and information read out from the storage unit storing the information indicating a correlation between a first dark signal corresponding to a dark charge generated in the photoelectric conversion element and a second dark signal corresponding to a second dark charge generated in the charge holding unit, in a state where the imaging element is shielded from light.

14. The imaging method according to claim 13,
wherein the information indicating the correlation is a coefficient of a function representing the first dark signal using the second dark signal as a variable, and
wherein in the image processing step, the black level is calculated by an arithmetic operation in which each of signals constituting the dark image signal is set as a variable of the function.

15. The imaging method according to claim 14,
wherein the coefficient is stored in the storage unit in association with each of the plurality of pixels, and
wherein in the image processing step, the black level is calculated by an arithmetic operation in which each of the signals constituting the dark image signal is set as a variable of the function and the coefficient corresponding to the pixel from which each of the signals constituting the dark image signal is read out is set as a coefficient of the function.

16. The imaging method according to claim 13,
wherein the information is stored in the storage unit in association with each time of the exposure or each temperature of the imaging element, and
wherein in the image processing step, the black level is calculated using the information corresponding to the time of the exposure or the temperature of the imaging element.

17. The imaging method according to claim 13,
wherein the storage unit stores the information in association with a reference time of the exposure or a reference temperature of the imaging element, and further stores a relative value of the time of the exposure or the temperature of the imaging element with respect to the reference time or the reference temperature and correction information for correcting the information in association with each other, and
wherein in the image processing step, a relative value of the time of the exposure or the temperature of the imaging element with respect to the reference time or the reference temperature is obtained, the information is corrected by the correction information corresponding to the relative value, and the black level is calculated using the corrected information.

18. The imaging method according to claim 11,
wherein, in the driving control step, in a case where the time of the exposure is shorter than a threshold value, the second driving control is skipped and the first driving control and the third driving control are performed.

19. The imaging method according to claim 18,
wherein the threshold value is a time required for reading out a signal corresponding to the dark charge from each of the plurality of pixels by the second driving control.

20. The imaging method according to claim 11, further comprising:
a step of detecting a temperature of the imaging element,
wherein in the driving control step, in a case where the temperature of the imaging element is lower than a threshold value, the second driving control is skipped and the first driving control and the third driving control are performed.

21. A computer readable medium storing an imaging program for imaging an subject with a MOS type imaging element including a plurality of pixels including a photoelectric conversion element which receives light and accumulates charge, a charge holding unit which is shielded from light and holds the charge accumulated in the photoelectric conversion element, and a floating diffusion to which the charge is transferred from the charge holding unit, wherein a signal corresponding to a potential of the floating diffusion is read out by a readout circuit, the program causing a computer to execute:

a driving control step of performing a first driving control by which the photoelectric conversion element and the charge holding unit of the pixel are reset to start an exposure of the photoelectric conversion element, and an imaging charge accumulated in the photoelectric conversion element is transferred to the charge holding unit of the pixel to end the exposure, a second driving control by which the readout circuit reads out a signal corresponding to a dark charge held by the charge holding unit before the imaging charge is transferred to the charge holding unit by the first driving control, and a third driving control by which the readout circuit reads out the signal corresponding to the imaging charge held by the charge holding unit after the exposure ends by the first driving control; and an image processing step of generating a captured image data based on a captured image signal constituted by signals corresponding to the imaging charges read out from each of the plurality of pixels of the imaging element by the third driving control, and a dark image signal constituted by signals corresponding to the dark charges read out from each of the plurality of pixels of the imaging element by the second driving control, and storing the data to a storage medium.

* * * * *